US010910325B2

(12) United States Patent
Lim et al.

(10) Patent No.: US 10,910,325 B2
(45) Date of Patent: Feb. 2, 2021

(54) INTEGRATED CIRCUIT PACKAGES WITH CONDUCTIVE ELEMENT HAVING CAVITIES HOUSING ELECTRICALLY CONNECTED EMBEDDED COMPONENTS

(71) Applicant: Intel Corporation, Santa Clara, CA (US)

(72) Inventors: Seok Ling Lim, Kulim (MY); Jenny Shio Yin Ong, Bayna Lepas (MY); Bok Eng Cheah, Gellugor (MY); Jackson Chung Peng Kong, Tanjung Tokong (MY)

(73) Assignee: Intel Corporation, Santa Clara, CA (US)

( * ) Notice: Subject to any disclaimer, the term of this patent is extended or adjusted under 35 U.S.C. 154(b) by 169 days.

(21) Appl. No.: 15/974,393

(22) Filed: May 8, 2018

(65) Prior Publication Data
US 2018/0342467 A1 Nov. 29, 2018

(30) Foreign Application Priority Data
May 29, 2017 (MY) .............................. 2017701956

(51) Int. Cl.
*H01L 23/00* (2006.01)
*H01L 23/528* (2006.01)
(Continued)

(52) U.S. Cl.
CPC ............ *H01L 23/562* (2013.01); *H01L 23/13* (2013.01); *H01L 23/50* (2013.01);
(Continued)

(58) Field of Classification Search
CPC ....... H01L 23/00; H01L 23/528; H01L 49/02; H01L 23/562; H01L 24/09;
(Continued)

(56) References Cited

U.S. PATENT DOCUMENTS 6,710,444 B2   3/2004  Xie et al.
6,803,653 B1 * 10/2004  Likins .................... H01L 23/36
                                                257/666
(Continued)

OTHER PUBLICATIONS

U.S. Appl. No. 16/022,152, filed Jun. 28, 2018, entitled "Microelectronic Assemblies," First Named Inventor: Digvijay Raorane.

*Primary Examiner* — Alexander O Williams
(74) *Attorney, Agent, or Firm* — Patent Capital Group

(57) ABSTRACT

Disclosed herein are integrated circuit (IC) structures with a conductive element coupled to a first surface of a package substrate, where the conductive element has cavities for embedding components and the embedded components are electrically connected to the conductive element, as well as related apparatuses and methods. In some embodiments, embedded components have one terminal end, which may
(Continued)

be positioned vertically, with the terminal end facing into the cavity, and coupled to the conductive element. In some embodiments, embedded components have two terminal ends, which may be positioned vertically with one terminal end coupled to the conductive element and the other terminal end coupled to the package substrate. In some embodiments, embedded components include passive devices, such as capacitors, resistors, and inductors. In some embodiments, a conductive element is a stiffener.

24 Claims, 10 Drawing Sheets

(51) Int. Cl.
    *H01L 49/02*     (2006.01)
    *H01L 23/50*     (2006.01)
    *H01L 23/13*     (2006.01)
    *H01L 23/498*     (2006.01)

(52) U.S. Cl.
    CPC .......... *H01L 23/5283* (2013.01); *H01L 24/09* (2013.01); *H01L 24/32* (2013.01); *H01L 28/10* (2013.01); *H01L 28/20* (2013.01); *H01L 28/40* (2013.01); *H01L 23/49816* (2013.01); *H01L 23/49822* (2013.01); *H01L 24/16* (2013.01); *H01L 2224/16227* (2013.01); *H01L 2924/15192* (2013.01); *H01L 2924/19105* (2013.01)

(58) Field of Classification Search
    CPC ..... H01L 23/5283; H01L 28/40; H01L 28/10; H01L 28/20; H01L 24/32; H01L 28/30; H01L 23/13; H01L 23/50; H01L 2924/3511; H01L 23/49822; H01L 24/16; H01L 2924/19105; H01L 12/49816; H01L 2224/16227; H01L 2924/15192
    USPC .......................................................... 257/678
See application file for complete search history.

(56) References Cited

U.S. PATENT DOCUMENTS

| | | |
|---|---|---|
| 6,821,823 B2 | 11/2004 | Xie et al. |
| 8,847,383 B2 | 9/2014 | McLellan et al. |
| 9,196,575 B1* | 11/2015 | Lee ................... H01L 23/3675 |
| 9,275,876 B2 | 3/2016 | Kim et al. |
| 10,015,885 B2* | 7/2018 | Jung ..................... H05K 1/183 |
| 2005/0047094 A1 | 3/2005 | Hsu et al. |
| 2005/0206034 A1* | 9/2005 | Yokoyama ............. B29C 33/50 |
| | | 264/219 |
| 2009/0057913 A1* | 3/2009 | Hsu ..................... H01L 23/5389 |
| | | 257/774 |
| 2012/0182066 A1* | 7/2012 | Merkle ................ H05K 1/0243 |
| | | 327/564 |
| 2014/0042607 A1* | 2/2014 | Knickerbocker ....... H01L 25/50 |
| | | 257/685 |
| 2015/0091132 A1 | 4/2015 | Kim et al. |
| 2015/0207050 A1* | 7/2015 | Tsukada ............. H01L 23/49827 |
| | | 257/693 |
| 2015/0235935 A1* | 8/2015 | Lin ................... H01L 23/49827 |
| | | 257/693 |
| 2017/0041692 A1* | 2/2017 | Watson .................. H04R 1/023 |
| 2017/0092412 A1 | 3/2017 | Manusharow et al. |
| 2017/0229368 A1* | 8/2017 | Chiu ..................... H01L 23/055 |
| 2017/0358542 A1* | 12/2017 | Yeh ........................ H01L 23/367 |
| 2018/0019192 A1* | 1/2018 | Chen ................... H01L 23/3128 |
| 2018/0145042 A1 | 5/2018 | Lim et al. |
| 2018/0203495 A1* | 7/2018 | Campbell ............ H05K 1/0271 |
| 2018/0286780 A1* | 10/2018 | Qi ........................ H01L 23/552 |
| 2018/0286797 A1* | 10/2018 | Goh ........................ H01L 23/50 |
| 2020/0006166 A1 | 1/2020 | Raorane et al. |

* cited by examiner

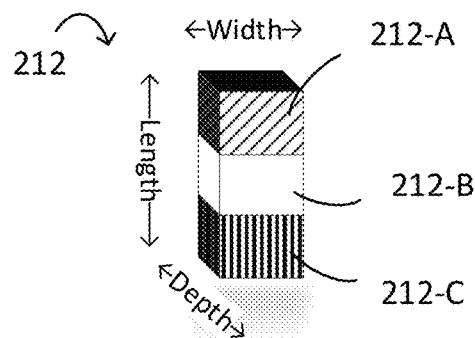
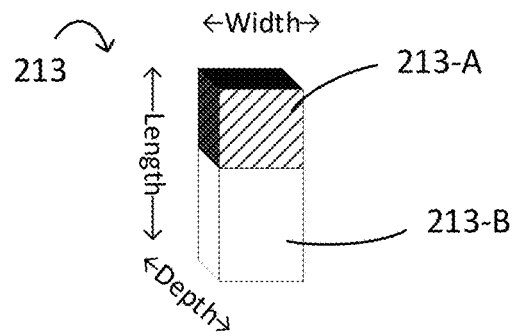
FIG. 2A    FIG. 2B
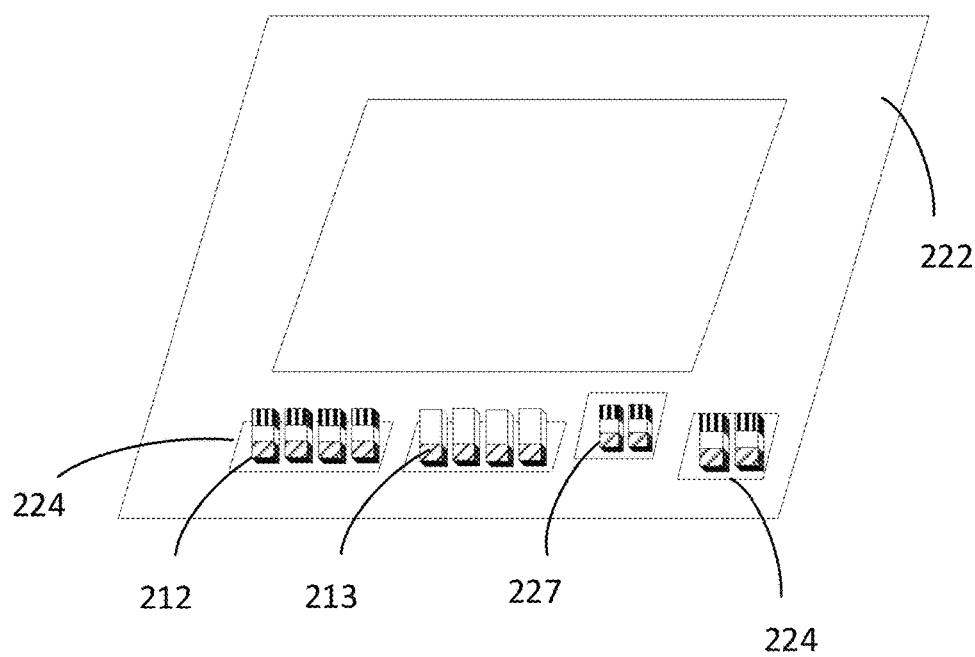
FIG. 2C

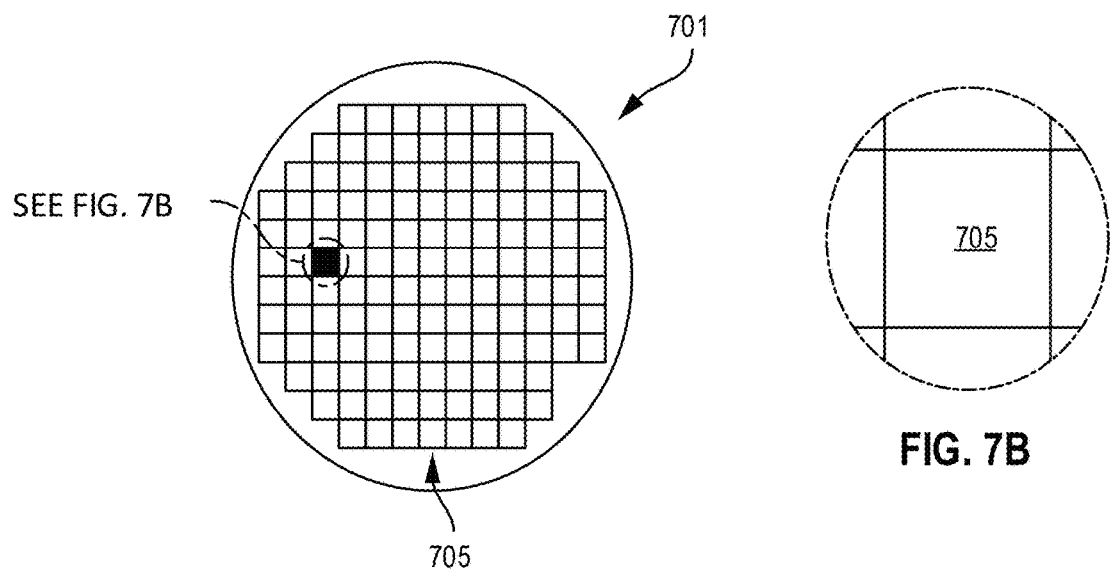
FIG. 7A
FIG. 7B
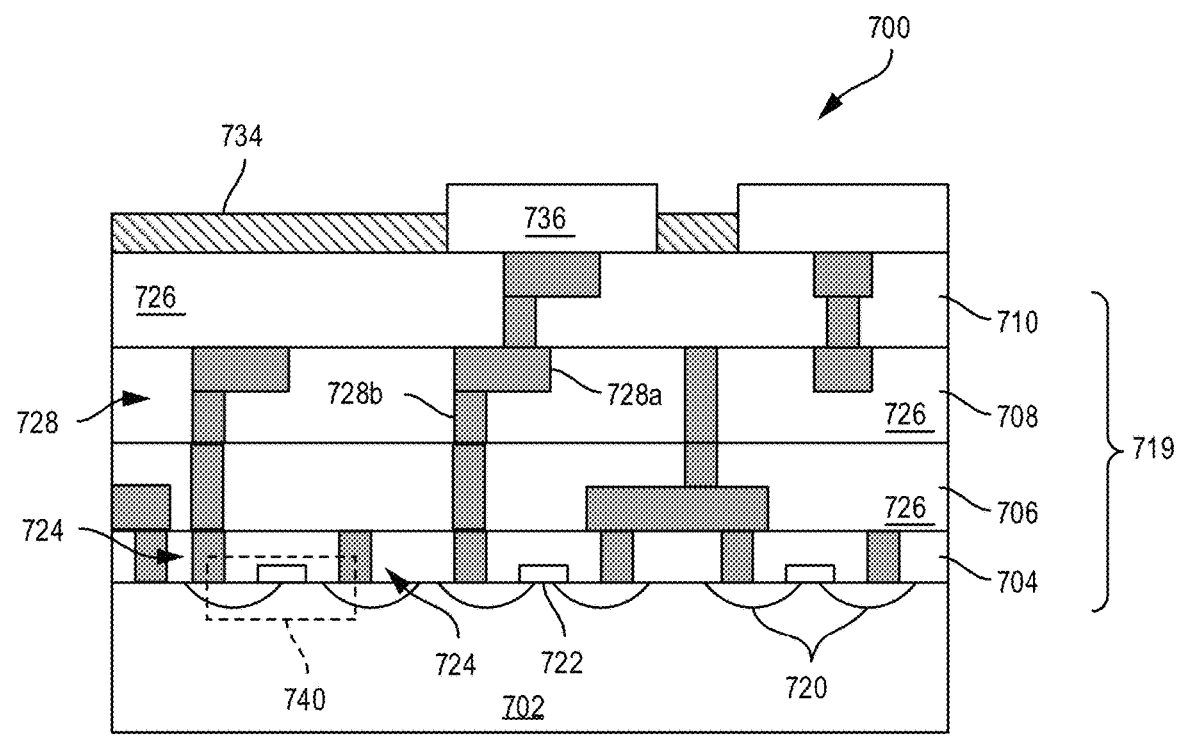
FIG. 7C

INTEGRATED CIRCUIT PACKAGES WITH CONDUCTIVE ELEMENT HAVING CAVITIES HOUSING ELECTRICALLY CONNECTED EMBEDDED COMPONENTS

CROSS REFERENCE TO RELATED APPLICATION

This application claims priority to Malaysia Patent Application No. PI 2017701956, filed May 29, 2017, and titled "INTEGRATED CIRCUIT PACKAGES WITH CONDUCTIVE ELEMENT HAVING CAVITIES HOUSING ELECTRICALLY CONNECTED EMBEDDED COMPONENTS," the entire contents of which are hereby incorporated by reference.

BACKGROUND

Package substrates are traditionally used to route electrical connections between a die and a circuit board. Dies and other functional components and elements may be disposed on a face of a package substrate. For example, stiffeners may be disposed on a face of the package substrate along with the die to prevent warpage, which is especially useful in coreless, ultra-thin core (UTC), and wafer level integrated circuit products.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A and 2B are examples of components that may be embedded in and electrically connected to a conductive element, in accordance with various embodiments.

FIG. 2C is a schematic illustration of a first face of a conductive element showing cavities with embedded components of FIGS. 2A and 2B having a vertical arrangement, in accordance with various embodiments.

FIGS. 7A and 7B are top views of a wafer and dies that may be used with any of the embodiments of the integrated circuit (IC) structures disclosed herein.

FIG. 7C is a cross-sectional side view of an integrated circuit device that may be used with any of the embodiments of the IC structures disclosed herein.

DETAILED DESCRIPTION

Figure 1A:
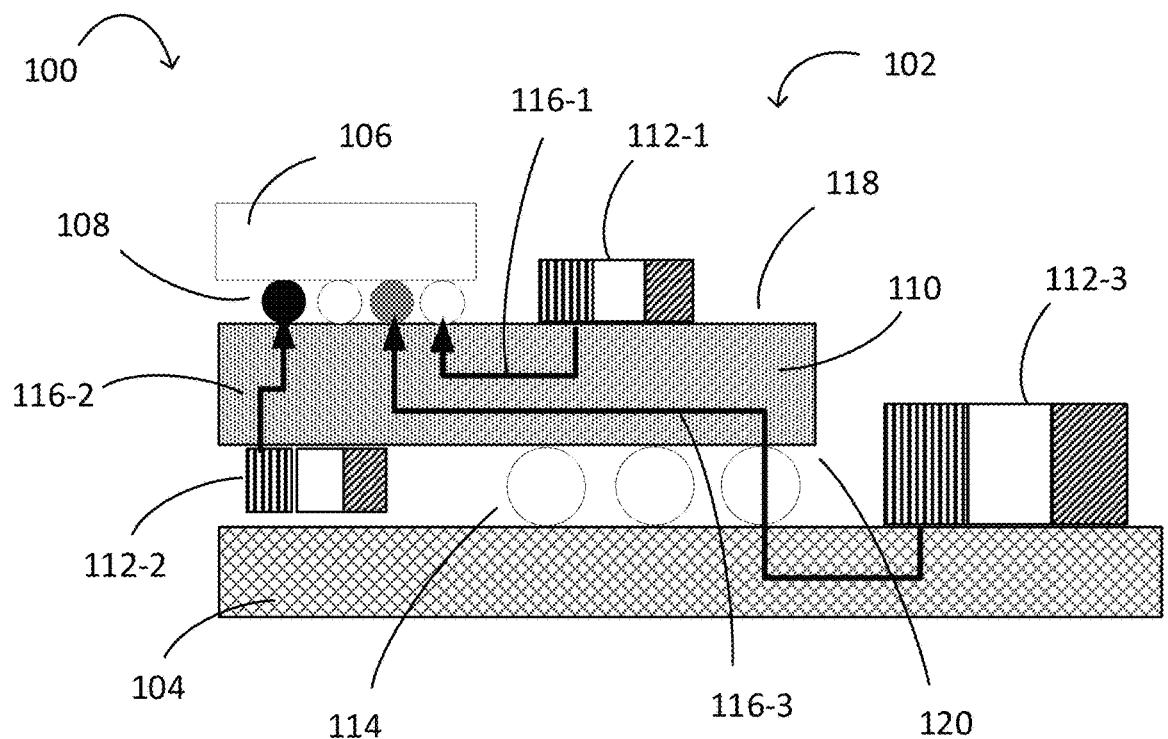
FIG. 1A is a schematic illustration of a cross-sectional view of a portion of an integrated circuit (IC) assembly having components on both surfaces of a package substrate and on a motherboard.

Disclosed herein are package substrates with a conductive element having cavities with embedded components that are electrically connected to the conductive element, as well as related apparatuses and methods. For example, in some embodiments, a package substrate may include a conductive element coupled to a first or top surface of the package substrate, where a first face or surface of the conductive element has cavities for embedding the components and the embedded components are electrically connected to the conductive element. In some embodiments, embedded components include devices having two terminal ends, which may be positioned vertically with one terminal end at the top, (i.e., the first terminal end facing into the cavity) coupled to the conductive element and the other terminal end at the bottom coupled to the package substrate. In some embodiments, embedded components include devices having one terminal end, which may be positioned vertically with the terminal end at the top (i.e., the first terminal end facing into the cavity) coupled to the conductive element. In some embodiments, the conductive element is coupled to a ground (Vss) reference voltage through routing interconnects in the package substrate. In some embodiments, the conductive element is coupled to a power (Vcc) source or reference voltage through routing interconnects in the package substrate. In some embodiments, embedded components include passive devices, such as capacitors, resistors, inductors, and other passive devices, such as silicon capacitors, and silicon metal-in-metal (MIM) capacitors. In some embodiments, embedded components include active devices, such as memory dies, and field programmable gate array (FPGA) silicon dies. In some embodiments, the conductive element is a metal stiffener.

Various ones of the embodiments disclosed herein provide for a package substrate having a conductive element with opposing first and second surfaces, where the first surface or face of the conductive element has cavities for embedding and coupling components to the conductive element. The package substrate also includes opposing first and second surfaces. The first surface of the conductive element having one or more cavities may be coupled to a first surface of a package substrate, such that the first surface of the conductive element is adjacent to the first surface of the package substrate and the second surface faces outward. Multiple components for providing and improving integrated circuit functionality may be disposed on the first and second surfaces of the package substrate. For example, the first and second surfaces of a package substrate may include one or more dies as well as other active and passive components. Space is limited on the first and second surfaces of the package substrate and, by disposing devices on both surfaces, the package footprint is likely to increase in order to maintain similar input/output (I/O) density. Conductive elements with cavities for embedding and coupling components in a vertical arrangement may be used to maximize the surface real-estate of the package substrate such that all components may be disposed on a single surface of the package substrate to enable increased ball grid array I/O density on the second surface of the package substrate.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. The accompanying drawings are not necessarily drawn to scale.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The term "between," when used with reference to measurement ranges, is inclusive of the ends of the measurement ranges. As used herein, the notation "A/B/C" means (A), (B), and/or (C).

The terms "left," "right," "front," "upper," "lower," "back," "top," "bottom," "over," "under," "on," "between," and the like in the description and in the claims, if any, are used for descriptive purposes and not necessarily for describing permanent relative positions. For example, one layer over, or under another layer may be directly in contact with the other layer or may have one or more intervening layers. Moreover, one layer between two layers may be directly in contact with the two layers or may have one or more intervening layers. In contrast, a first layer "on" a second layer is in direct contact with that second layer. Similarly, unless explicitly stated otherwise, one feature between two features may be in direct contact with the adjacent features or may have one or more intervening layers.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Components disposed on the surfaces of a package substrate may be critical for integrated circuit performance and efficiency. For example, a capacitor is a crucial passive component in the IC package that helps to reduce power supply noise and maintain a steady power supply. The placement of the capacitor is key as the distance from the power supply affects the effectiveness of the capacitance and loop inductance for power integrity. Generally, as the distance of the capacitor from the power delivery network increases, the effectiveness of the capacitance and the loop inductance for power integrity decreases. To reduce the z-height of an integrated circuit package, a package substrate may be made thinner but thinner substrates may be more likely to warp. To address substrate warpage, a stiffener may be included on the die side of the package substrate. A stiffener may be designed to provide stability to a package substrate. Improved stability may be particularly advantageous in situations where the package substrate is a thin core or coreless substrate. A stiffener may be fabricated from materials that exhibit desirable mechanical strength and some resistance to corrosion. Attaching a stiffener to the first surface of the package substrate to prevent warpage may further reduce the ability to couple components adjacent to a die. The use of a conductive element with cavities for embedding components increases available area for coupling components on the surface of the package substrate as well as enabling coupling the embedded components to the conductive element.

The exemplary embodiments described herein further increase the available surface area on a package substrate by positioning a component vertically rather than horizontally and coupling the component to a conductive element and, optionally, coupling the component to the package substrate. By positioning components vertically, the footprint or surface area required by the components may be reduced by as much as fifty percent. As such, the power integrity performance of the integrated circuit may also be improved as more components may be placed adjacent to a die, which results in a shorter inductance loop (i.e., shorter routing distance between silicon device power delivery network and capacitor). The I/O routing capacity on the package substrate surface layers may be increased as well. Moreover, by increasing the available space on a first surface of a package substrate, the need to place components on a second surface of the package substrate and on the circuit board may be eliminated, and the overall z-height of the package may be reduced. Further, by eliminating components from a second surface of the package substrate, a ball grid array (BGA) may be populated across the entire package for improved device performance/functionality through increased BGA I/O density.

FIG. 1A depicts some current solutions to meeting the power integrity requirements for continuous bandwidth and device performance scaling. FIG. 1A is a cross-sectional side view of a portion of an integrated circuit (IC) assembly 100 including an IC package 102 having a package substrate 110, and at least one die 106 and multiple components 112-1, 112-2 disposed thereon. In particular, the die 106 may be coupled to a first face 118 of the package substrate 110 via first level interconnects 108, as illustrated. In some embodiments, the first level interconnects 108 may include solder bumps or balls (as illustrated in FIG. 1A); in other embodiments, the first level interconnects 108 may include wirebonds or any other suitable interconnect. Although one die 106 is illustrated in FIG. 1A, this is simply an example, and the IC package 102 may include one or more dies 106. The dies may perform any suitable functionality, and may include processing devices, memory, communications devices, sensors, or any other computing components or circuitry. In some embodiments, an underfill material (not shown) may be disposed between the die 106 and the first face 118 of the package substrate 110. In some embodiments, an overmold or fill material (not shown) may be disposed around the die 106 and in contact with the first face 118 of the package substrate 110.

In FIG. 1A, the package substrate 110 may have a thickness of approximately 600 microns (um) to 1.2 millimeters (mm) such that warpage is negligible. The package substrate 110 may be coupled to a circuit board 104 via the second level interconnects 114 disposed at the second face 120 of the package substrate 110. In some embodiments, the second level interconnects 114 may include solder balls (as illustrated in FIG. 1A) for a ball grid array (BGA) coupling; in other embodiments, the second level interconnects 114 may include solder paste contacts to provide land grid array (LGA) interconnects, or any other suitable interconnect. In some embodiments, the circuit board 104 may include one or more components 112-3 disposed thereon. The circuit board 104 may include conductive pathways that allow power, ground, and other electrical signals to move between the circuit board 104 and the IC package 102 as well as between the circuit board 104 and coupled components 112-3, as known in the art.

Although FIG. 1A illustrates a single IC package 102 disposed on the circuit board 104, this is simply for ease of illustration and multiple IC packages may be disposed on the circuit board 104 (e.g., as discussed below with reference to the circuit board 802 of the assembly 800 of FIG. 8). In some embodiments, the circuit board 104 may be a printed circuit board (PCB) (e.g., a motherboard). In some embodiments, the circuit board 104 may be another IC package, and the IC assembly 100 may be a package-on-package structure. In some embodiments, the circuit board 104 may be an interposer, and the IC assembly 100 may be a package-on-interposer structure.

The package substrate 110 and circuit board 104 may include one or more components 112-1, 112-2, 112-3 disposed thereon, in accordance with various embodiments. A component 112 may include one or more capacitors, resistors, and/or inductors. For example, as shown in FIG. 1A, component 112-1 may be a die side capacitor disposed on the first surface 118 of the package substrate 110, component 112-2 may be a land side capacitor disposed on the second surface 120 of the package substrate 110, and component 112-3 may be an edge capacitor disposed on the top surface of the circuit board 104. As illustrated, conductive components 112 include a non-conductive middle sandwiched between two conductive or terminal ends. As used herein, conductive end, terminal end, conductive terminal, and conductive terminal end may refer to the conductive part of the component and may be used interchangeably. Conductive terminals have separate electrical connections and require a potential difference to exist between terminals. The package substrate 110 may include multiple components 112 disposed at different lateral locations on the first face 118 and second face 120 of the package substrate 110 (e.g., in the x-direction). The package substrate 110 may also include conductive pathways 116-1, 116-2, 116-3 that may couple the die 106 to the surface components 112-1, 112-2, 112-3, and conductive pathways (not shown) that may couple the die 106 to the circuit board 104 (e.g., via the first level interconnects 108 and the second level interconnects 114). Any suitable arrangement of conductive pathways 116 may couple the dies 106, the components 112, and the circuit board 104, as desired. Placing the multiple components 112 on the package substrate 110 and circuit board 104 surfaces requires a tradeoff. For example, land side capacitor 112-2 reduces the BGA and I/O capacity while board edge capacitor 112-3 reduces capacitor performance due to the longer inductance loop 116-3. The length of an inductance loop is a key factor in determining power integrity performance; a shorter inductance loop optimizes performance. The inductance loop is directly proportional to the distance between the capacitor and the power delivery network. As a result, a die side capacitor having a shorter inductance loop is typically more effective compared to board edge capacitors and land side capacitors (depending on the package substrate thickness and routing length).

Figure 1B:
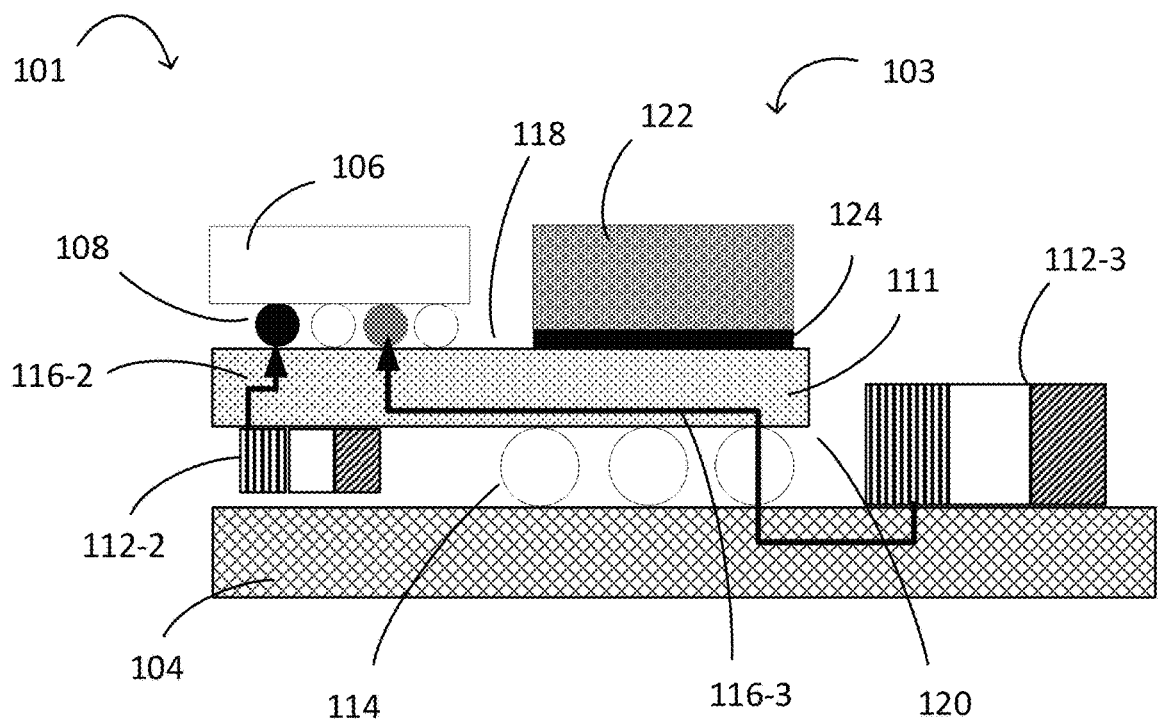
FIG. 1B is a schematic illustration of a cross-sectional view of a portion of an IC assembly having a stiffener and components on the lower surface of a package substrate and on a motherboard.

FIG. 1B is a cross-sectional view of a portion of an integrated circuit assembly 101, which is similar to integrated circuit assembly 100 in FIG. 1A, having a thinner package substrate 111 to reduce z-height and a stiffener 122 attached to the first surface 118 of the package substrate (e.g., through adhesive layer 124) to reduce warpage. For example, package substrate 111 may be a coreless, an ultra-thin core (UTC), a wafer level packaging, or any other suitable package designed to minimize z-height, as is known in the art. As depicted in FIG. 1B, the use of a stiffener 122 to prevent warpage may reduce the ability to place components adjacent to the one or more dies (i.e., component 112-1 has been removed to allow space for the stiffener), which is likely to reduce power integrity performance as well.

FIGS. 2A and 2B are examples of components that may be embedded in and electrically connected to a conductive element, in accordance with various embodiments. As shown in FIG. 2A, conductive component 212 includes a non-conductive middle 212-B sandwiched between two conductive terminals or ends 212-A, 212-C. Conductive terminals 212-A, 212-C require a potential difference to exist between terminals, such as power (Vcc) reference voltage and ground (Vss) reference voltage. For example, if conductive terminal 212-A is connected to a reference voltage (i.e., ground or Vss reference voltage), then conductive terminal 212-C may be connected to an opposite reference voltage (e.g., power or Vcc reference voltage), and, likewise, if conductive terminal 212-A is connected to a Vcc reference voltage, then conductive terminal 212-C may be connected to a Vss reference voltage. As shown in FIG. 2B, conductive component 213 includes a first conductive end 213-A and a non-conductive end 213-B. The terminal ends electrically connected to the conductive element will be connected to the same reference voltage as the conductive element, i.e., ground or power. In some embodiments, an integrated circuit package substrate may have a plurality of discrete conductive elements, where one conductive element may be electrically connected to ground reference voltage and an other conductive element may be electrically connected to power reference voltage. As used herein, when referring to an electrical connection to a reference voltage, the terms coupled to, connected to, and associated with, may be used interchangeably.

A component may have any suitable dimensions, and component dimensions may vary according to application, construction, and design requirements (e.g., specific z-height dimension) of an integrated circuit package. In some embodiments, a component may have a body length-dimension ranging from 150 um to 600 um and a terminal width-dimension ranging from 100 um to 2 mm. In some embodiments, the embedded component is a passive component, including a resistor, a capacitor, an inductor, or a chip-type passive component, such as silicon capacitor or a silicon metal-in-metal (MIM) capacitor. In some embodiments, the embedded component is an active component, such as a memory die, a field programmable gate array (FPGA) silicon die, or a chip-type active component, where the active circuitry (transistor) is coupled to the conductive element, for example, through silicon via (TSV) structures and to the package through solder bumps.

FIG. 2C is a schematic illustration of a first face of a conductive element having cavities with embedded components of FIGS. 2A and 2B positioned in a vertical arrangement (i.e., the first terminal end facing into the cavity), in accordance with various embodiments. As used herein, a component having a vertical arrangement or a vertical position refers to rotating the component 90 degrees vertically, such that the terminal ends, which typically are positioned left and right of each other, are positioned top and bottom of each other (e.g., along a Z-axis). FIG. 2C shows a conductive element 222 having recessed cavities 224 for embedding components, such as components 212, 213, in accordance with various embodiments. In some embodiments, an embedded component may be positioned vertically within the cavity. In some embodiments, an embedded component may be positioned horizontally within the cavity.

In some embodiments, some embedded components may be positioned vertically and some embedded components may be positioned horizontally. In some embodiments, a two-terminal end, horizontally positioned component may be electrically connected to the conductive element via one terminal end and electrically connected to the package substrate via the other terminal end, and each terminal end may have dielectric material to prevent another electrical connection.

A cavity may be formed to include one or more embedded components as necessary so that the conductive element cavities correspond to package substrate features. A cavity 224 may be formed by any suitable process, including stamping and embossing, among others. A cavity may have any suitable size and shape, and may be adjusted based on the component and the component arrangement housed within the recessed cavity. For example, a cavity having a vertically positioned component may be deeper and shorter in length as compared to a cavity housing a horizontally positioned component. In some embodiments, a cavity may house both horizontally positioned and vertically positioned components, such that the cavity dimensions may be formed to house both components and may be larger to accommodate the larger component in a specific dimension. In some embodiments, cavity size may range from 125 um by 125 um to 3 mm by 2 mm, including any and all dimensions in between. In some embodiments, cavity depth may range from 150 um to 350 um, and may vary depending on the thickness of conductive element. The one or more cavities for housing components may be positioned in any suitable location on the conductive element, and may be adjusted to match component placement and electrical connections on the package substrate. For example, the one or more cavities may be aligned horizontally or vertically on the conductive element, or may be patterned to match the component arrangement on the package substrate. A cavity may have any suitable electrical connections for coupling embedded components to the conductive element, including, for example, solder layer or conductive adhesive. An electrical connection for connecting an embedded component to the conductive element may be positioned at any suitable location within the cavity, including on the first surface of the recessed cavity and/or on a side wall of the recessed cavity. In some embodiments, the embedded components in each cavity may be configured to be coupled to a dedicated power plane, and may be coupled to a different power plane than a neighboring cavity. In some embodiments, one or more of the embedded components in the one or more of the cavities may be electrically configured to be connected to a common power delivery network or power plane. In some embodiments, one or more of the embedding components in each cavity may be electrically configured to be connected to a common and/or different power delivery network or power plane.

As shown in FIG. 2C, one or more conductive components 212, 213 may be embedded in one or more cavities 224 of conductive element 222. Each cavity may include one or more of the same type of component or may include different types of components. As depicted, each cavity 224 may include a plurality of embedded components. When positioned vertically, the first conductive end 212-A, 213-A of the components 212, 213 may be positioned at the top of the embedded component and electrically connected to the conductive element 222. The conductive element and second conductive end of the components may be electrically connected to a power (Vcc) routing trace or a ground (Vss) routing trace on a package substrate based on predetermined routing of conductive pathways on the package substrate, and, then, connected to other devices, such as a die. The electrical connection between the embedded component 212, 213 and the conductive element 222 may be of any suitable form, including conductive adhesive and solder layer, among others.

The conductive element 222 may be made of any suitable conductive material or combination of materials, including, for example, copper, nickel, aluminum, titanium, stainless steel, beryllium (Be), molybdenum (Mo), tungsten (W), silicon carbide (SiC), tungsten carbide (WC), and various combinations of these materials. In some embodiments, the conductive element is a stiffener that provides stiffening or stability to a substrate, such as, for example, a material with a high Young's modulus (i.e., Young's modulus value of about 90 GPa or greater). The conductive element may be of any suitable shape and size, including, in the shape of a frame or ring having a generally rectangular cross-section that surrounds a die on all sides. The conductive element may be of any suitable thickness. The thickness of the conductive element may depend on the type of material or materials used to control warpage, and may further depend on the size of the embedded components. In some embodiments, the thickness of the conductive element may range from 50 um to 800 um. In some embodiments, the thickness of the conductive element may range from 100 um to 300 um. In some embodiments, the conductive element may have a protective layer or other layer deposited on the second surface to, for example, prevent metal oxidation or facilitate thermal dissipation.

In some embodiments, the one or more embedded components may be attached to the first surface within the conductive element cavity through the first terminal (e.g., Vss terminal) and an electrical connection, for example, a solder connection. The conductive element may be coupled to a reference voltage (e.g., ground (Vss) reference voltage) through a conductive adhesive layer (e.g., anisotropic conductive film, and conductive paste, among others), one or more Vss package substrate pads, and Vss package metal routing connected to the voltage reference sources. The second terminal of the one or more embedded components may be coupled to an opposite reference voltage (e.g., power (Vcc) reference voltage) through a solder connection on a first surface of the package substrate, one or more Vcc package substrate pads, and Vcc package metal routing connected to the respective voltage reference sources or networks. The electrical connection between the Vss reference voltage path (e.g., Vss package substrate pads and metal routing) and the Vcc reference voltage path (e.g., Vcc package substrate pads and metal routing) may be isolated by dielectric and/or solder resist material.

Figure 2D:
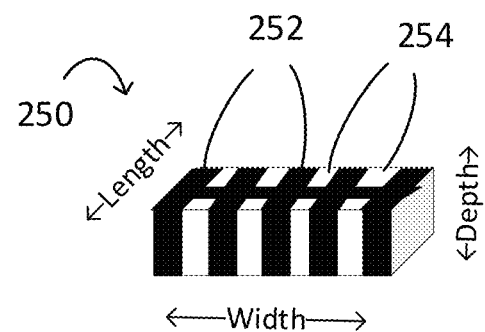
FIG. 2D is another example of a component that may be embedded in and electrically connected to a conductive element, in accordance with various embodiments.

FIG. 2D is another example of a component that may be embedded in and electrically connected to a conductive element, in accordance with various embodiments. FIG. 2D shows an array capacitor 250 including Vcc terminals 252 and Vss terminals 254 that may be electrically connected to the conductive element 222 and the package substrate (not shown).

Figure 2E:
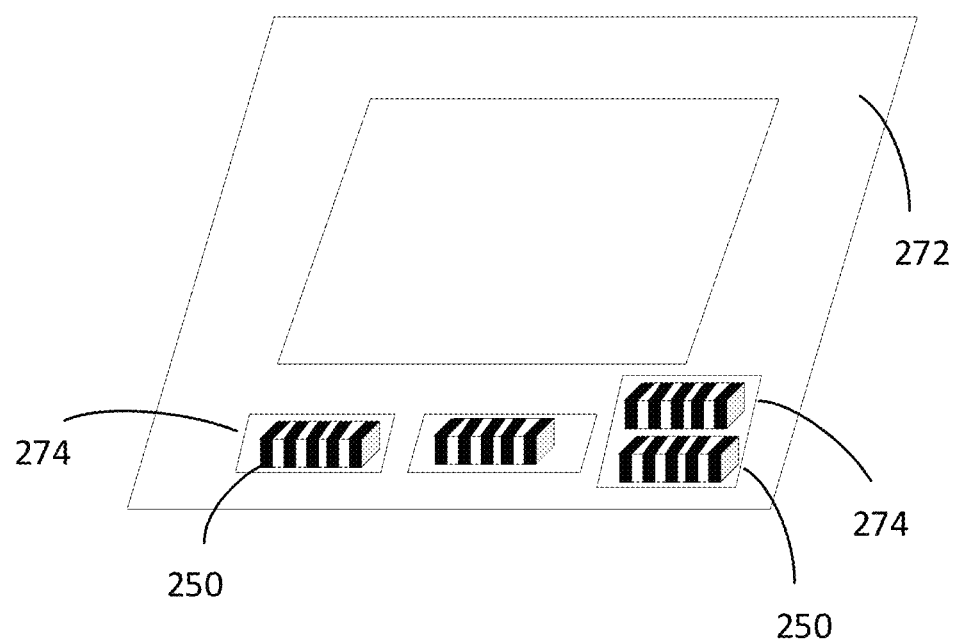
FIG. 2E is a schematic illustration of the lower face of a conductive element showing cavities with embedded components of FIGS. 2A, 2B, and 2D having a horizontal arrangement, in accordance with various embodiments.

FIG. 2E is a schematic illustration of the first face of a conductive element 272 showing cavities 274 with embedded components 250 of FIG. 2D having a horizontal arrangement, in accordance with various embodiments. The conductive element 222 may be made of any suitable conductive material or combination of materials, and may be of any suitable thickness, as described above with reference to FIG. 2C. Cavities may be of any suitable size and shape, and may have any suitable electrical connections for coupling embedded components to the conductive element, as described above with reference to FIG. 2C. As shown in FIG. 2E, one or more components may be positioned in a cavity.

Figure 3A:
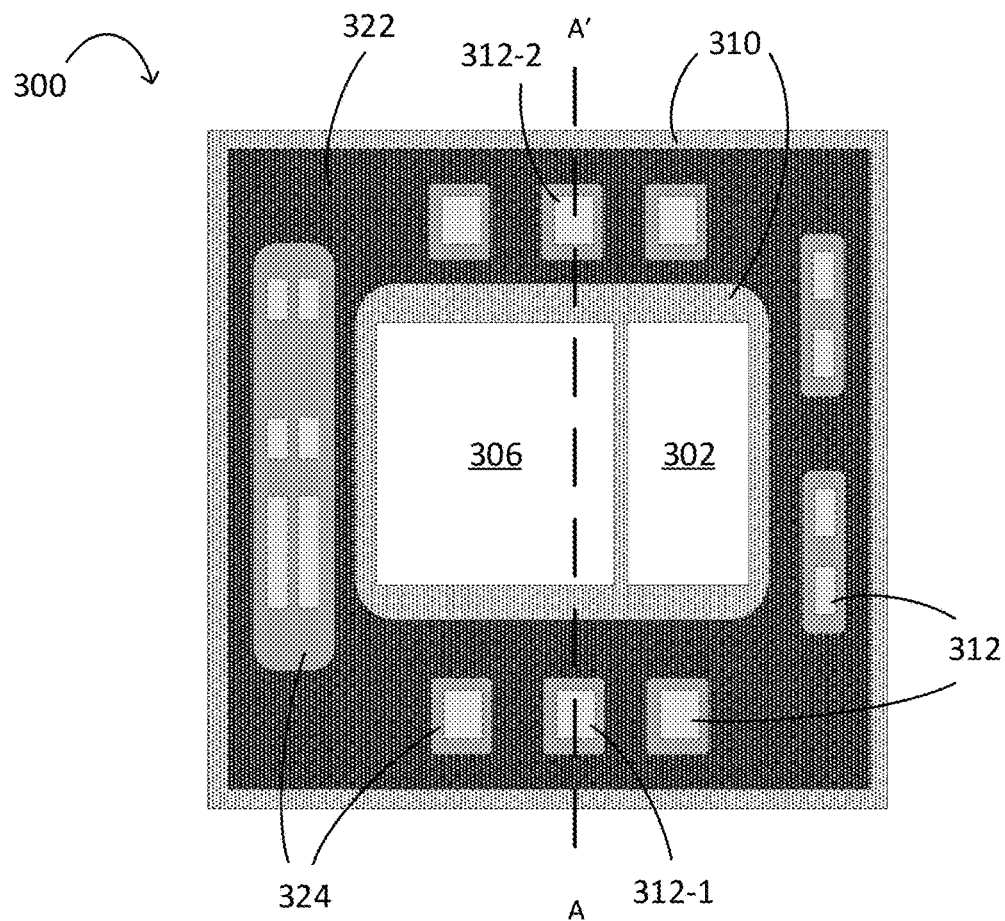
FIG. 3A is a schematic illustration of a top plane view of a portion of an example IC package having a package substrate that includes a conductive element with cavities for embedding components and electrical contacts for connecting the conductive element to the embedded components, in accordance with various embodiments.

FIG. 3A is a schematic illustration of a top plane view of an example IC package having a package substrate that includes a conductive element with cavities for embedding components and electrical contacts for coupling the embedded components to the conductive element, in accordance with various embodiments. FIG. 3A shows integrated circuit package 300 having package substrate 310 with two dies 302, 306 and a conductive element 322 attached to a first surface of the package substrate. Although only two dies are shown, a plurality of dies may be attached to the package substrate. The dies 302, 306 may be any type of dies, including, for example, a central processing unit (CPU), a platform controller hub (PCH), a DRAM memory, a graphic processing unit (GPU), and a field programmable gate array (FPGA), and may be electrically connected to the package substrate 310 via any suitable means, for example, controlled collapsed chip connection (C4) bumps, among others. Conductive element 322 may include one or more cavities 324 formed on the first surface of the conductive element adjacent to the package substrate, which may have one or more components 312 embedded therein. The cavities or trenches 324 in the conductive element 322 may be formed by any suitable means, including, for example, stamping, forging, and embossing, among others. The dotted lines, which form the cavities 324 and components 312 in FIG. 3A, indicate that the structures are located on the underside of the conductive element 322 and may not be visible from the top plane view. In some embodiments, the components 312 are passive components, including capacitors, resistors, and inductors. In some embodiments, the components 312 are active component, including memory or field programmable gate array (FPGA) silicon die. In some embodiments, the components 312 are electrically connected only to the conductive element 322 (not shown). In some embodiments, the components 312 may be electrically connected to the conductive element 322 and the package substrate (not shown).

The conductive element 322 may be made of any suitable conductive material or combination of materials, and may be of any suitable thickness, as described above with reference to FIG. 2C.

The conductive element 322 may be attached or secured to the package substrate using any suitable means, such as, for example, adhesive, conductive adhesive, solder paste materials, or solder balls. In some embodiments, contact pads may be formed between the conductive element and the package substrate. In some embodiments, a conductive adhesive may be disposed or solder balls formed between the conductive element and the conductive pads on the package substrate. In some embodiments, a solder resist may be disposed on the package substrate and openings may be formed through the solder resist and filled with conductive material to electrically connect the conductive element to the conductive routing on the package substrate. The conductive element 322 may have more than one means of attachment to the package substrate, for example, conductive adhesive may electrically couple the conductive element 322 to the package substrate 310 and a non-conductive adhesive, such as epoxy or silicon, may attach the conductive element 322 to the package substrate 310. In another example, an anisotropic conductive adhesive may be dispensed or printed on contact pads on the first surface of the package substrate and non-conductive adhesive may be dispensed in the non-pad areas. The adhesives may be cured, for example, under high pressure. In one embodiment, an anisotropic conductive adhesive may include fillers. A representative example of a filler is a conductive material-coated (e.g., metal-coated) elastomeric ball (e.g., gold or silver or silver/gold coated balls) or similar shaped materials that are compressible under bonding pressure. Fillers, such as elastomeric balls, may provide improved tolerance to process variations and improved contact in electrical performance in addition to providing a conductive pad between the conductive element and the package substrate. In another embodiment, the filler is a gold, silver, or silver/gold coated copper ball may be attached to the package substrate using conductive adhesive, or by any other suitable means, including, but not limited to, solder ball reflow process, among others. In some embodiments, conductive element 322 may be a planar metal piece that is substantially parallel to the first surface of the package substrate, such as a metal sheet or frame that surrounds a die. Although the conductive element 322 is shown as a single, continuous frame, the conductive element 322 may have any suitable shape and size, such as rectangular, square, or L-shaped, and may comprise a plurality of conductive elements. In some embodiments, conductive element 322 is continuous and covers the entire exposed first surface of the package substrate that surrounds the one or more dies. In some embodiments, conductive element 322 may have multiple segments and may cover only a portion of the exposed first surface of the package substrate.

Figure 3B:
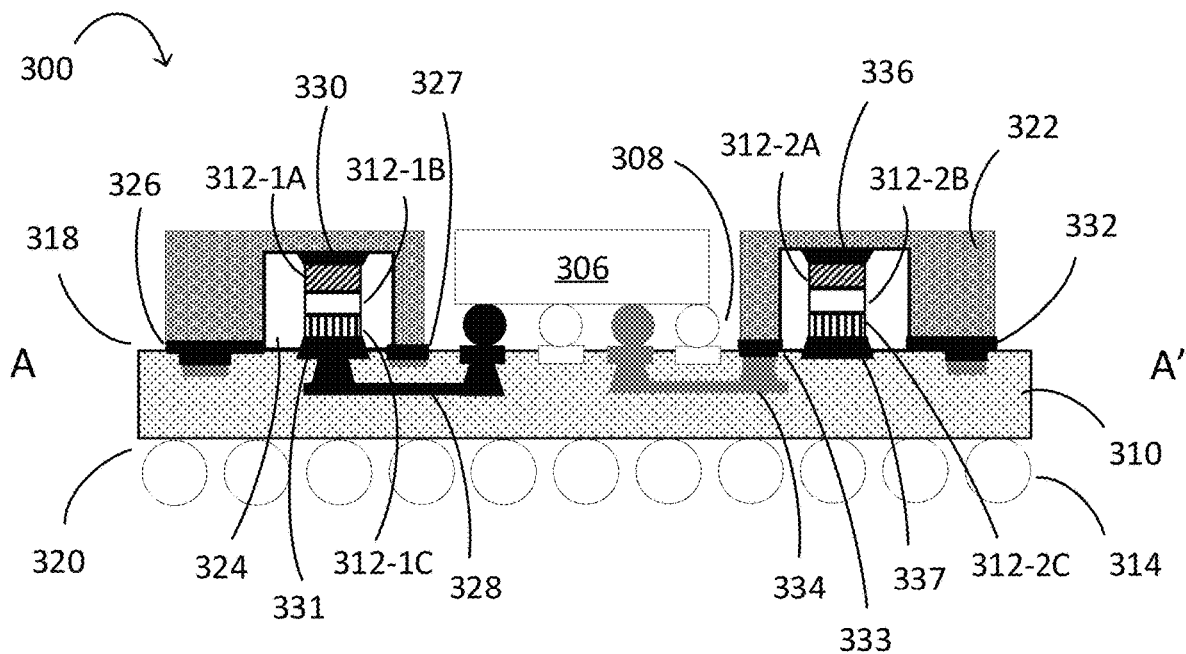
FIG. 3B is a schematic illustration of a cross-sectional side view of the IC package of FIG. 3A.

FIG. 3B is a schematic illustration of a cross-sectional side view along the A-A' line of the IC package of FIG. 3A. FIG. 3B shows integrated circuit package 300 having a package substrate 310, with the die 306 and the conductive element 322 with the embedded components 312-1, 312-2 disposed thereon. In particular, the die 306 may be coupled to a first face 318 of the package substrate 310 via first level interconnects 308. The package substrate 310 may be coupled to a circuit board (not shown) via the second level interconnects 314 disposed at the second face 320 of the package substrate 310. The conductive element 322 may be coupled to the package substrate 310 via one or more electrical connections 326, 327, 332, 333. The electrical connections 326, 327, 332, 333 may be designed to connect to corresponding ground and power sources. The conductive element 322 may include one or more cavities 324 on the first surface adjacent to the package substrate and may have one or more components 312-1, 312-2 attached within the cavities. As illustrated and as described previously in reference to FIG. 2A, conductive component 312-1 may include a non-conductive middle 312-1B sandwiched between two conductive terminals or ends 312-1A, 312-1C. Conductive terminals 312-1A, 312-1C require a potential difference to exist between terminals. For example, if conductive terminal 312-1A is connected to a reference voltage (i.e., ground or Vss reference voltage), then conductive terminal 312-1C may be connected to an opposite reference voltage (e.g., power or Vcc reference voltage), and, likewise, if conductive terminal 312-1A is connected to a Vcc reference voltage, then conductive terminal 312-1C may be connected to a Vss reference voltage. As depicted, a cavity may be formed to include one or more embedded components as necessary so that the conductive element cavities correspond to package substrate features. Conductive components 312-1, 312-2 are embedded in one or more cavities 324 of conductive element 322. The package substrate 310 may include conductive pathways 328, 334 that electrically connect the die 306 to the embedded component 312-1 and the die 306 to the conductive element 322, respectively.

As shown in FIG. 3B, component 312-1 may be positioned vertically with the two terminal ends at the top 312-1A and bottom 312-1C of the component. Conductive terminal 312-1A of embedded component 312-1 is electrically connected to conductive element 322 via contact 330, and conductive element 322 is electrically connected to package substrate 310 via contacts 326, 327, which are depicted as ground. Conductive terminal 312-1C of embedded component 312-1 is electrically connected to die 306 via contact 331 and conductive pathway 328, which are depicted as power. As shown in FIG. 3B, embedded component 312-2 has similar connections. Conductive terminal 312-2A of embedded component 312-2 is electrically connected to conductive element 322 via contact 336. Conductive element 322 is electrically connected to package substrate 310 via contacts 332, 333, and further connected to die 306 via conductive pathway 334. Electrical connections 332, 333, 334 are all depicted as connecting to ground. Conductive terminal 312-2C of embedded component 312-2 is electrically connected to package substrate 310 via contact 337, which is depicted as power. As would be understood by a person of skill in the art, the reference voltages of the electrical connections may be switched such that the conductive element (and upper terminal end) may be connected to power rather than ground, and the lower terminal end may be connected to ground rather than power. The electrical contacts 326, 327, 330, 331, 332, 333, 336, 337 may be any suitable electrical connection or combination of connections, including solder balls, anisotropic conductive film, conductive paste, and metal pads, among others, and may be isolated by dielectric material, e.g., a solder resist layer.

Figure 3C:
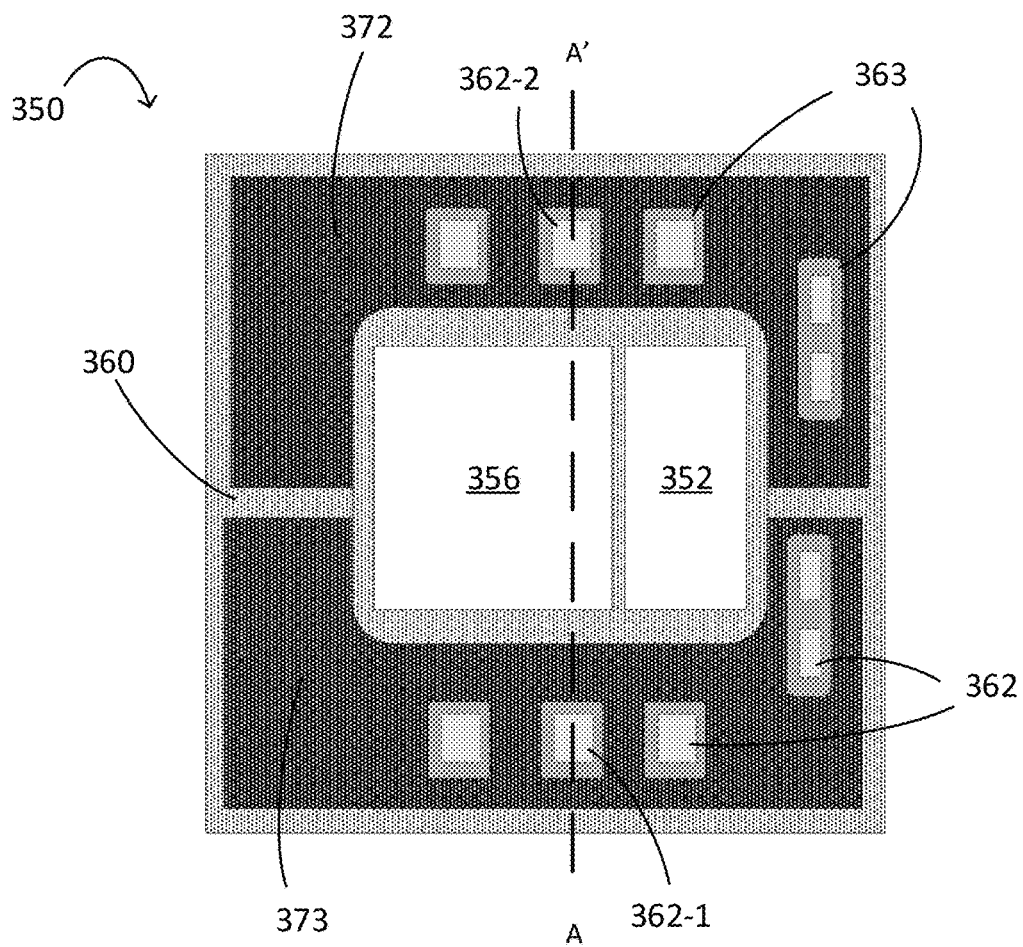
FIG. 3C is a schematic illustration of a top plane view of a portion of an example IC package having a package substrate that includes two conductive elements with cavities for embedding components and electrical contacts for connecting the conductive elements to the embedded components, in accordance with various embodiments.

FIG. 3C is a simplified schematic illustration of a top plane view of an example IC package having a package substrate that includes two conductive elements with cavities for embedding components and electrical contacts for coupling the embedded components to the conductive element, in accordance with various embodiments. FIG. 3C shows integrated circuit package 350 having package substrate 360 with two dies 352, 356, a first conductive element 372 and a second conductive element 373 having a plurality of cavities 363 and a plurality of embedded components 362, 362-1, 362-2.

Figure 3D:
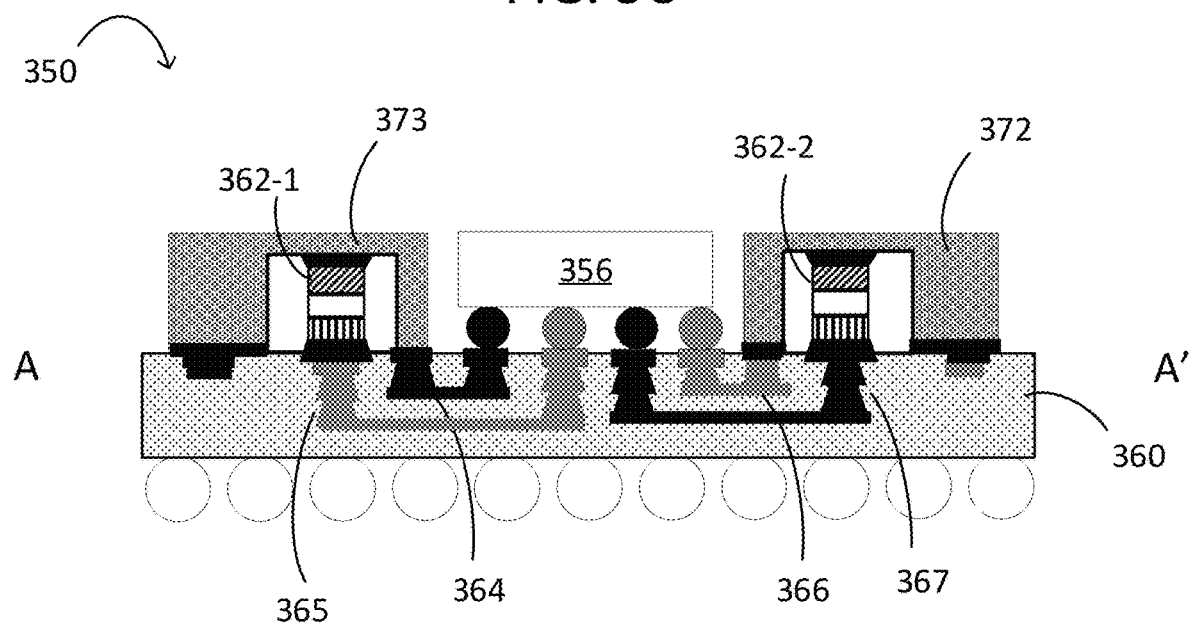
FIG. 3D is a schematic illustration of a cross-sectional side view of the IC package of FIG. 3C.

FIG. 3D is a simplified schematic illustration of a cross-sectional side view along the A-A' line of the IC package of FIG. 3C. FIG. 3D shows a simplified illustration of integrated circuit package 350 having a package substrate 360, die 356, a first conductive element 373 with embedded component 362-1, and a second conductive element 372 with embedded component 362-2, disposed thereon. In FIG. 3D, first conductive element 373 is connected to die 356 via conductive pathway 364, which as shown is power reference voltage, and the second terminal of embedded component 362-1 is electrically connected to die 356 via conductive pathway 365, which as shown is ground reference voltage. In FIG. 3D, second conductive element 372 is connected to die 356 via conductive pathway 366, which as shown, is ground reference voltage, and the second terminal of embedded component 362-2 is connected to die 356 via conductive pathway 367, which as shown is power reference voltage. Although FIGS. 3C and 3D show a package substrate with two discrete conductive elements a package substrate may have more than two conductive elements. As depicted in FIG. 3D, the first and second conductive elements are electrically connected to opposite reference voltages. In some embodiments, the first and second conductive elements may be connected to the same reference voltage (not shown).

Figure 4:
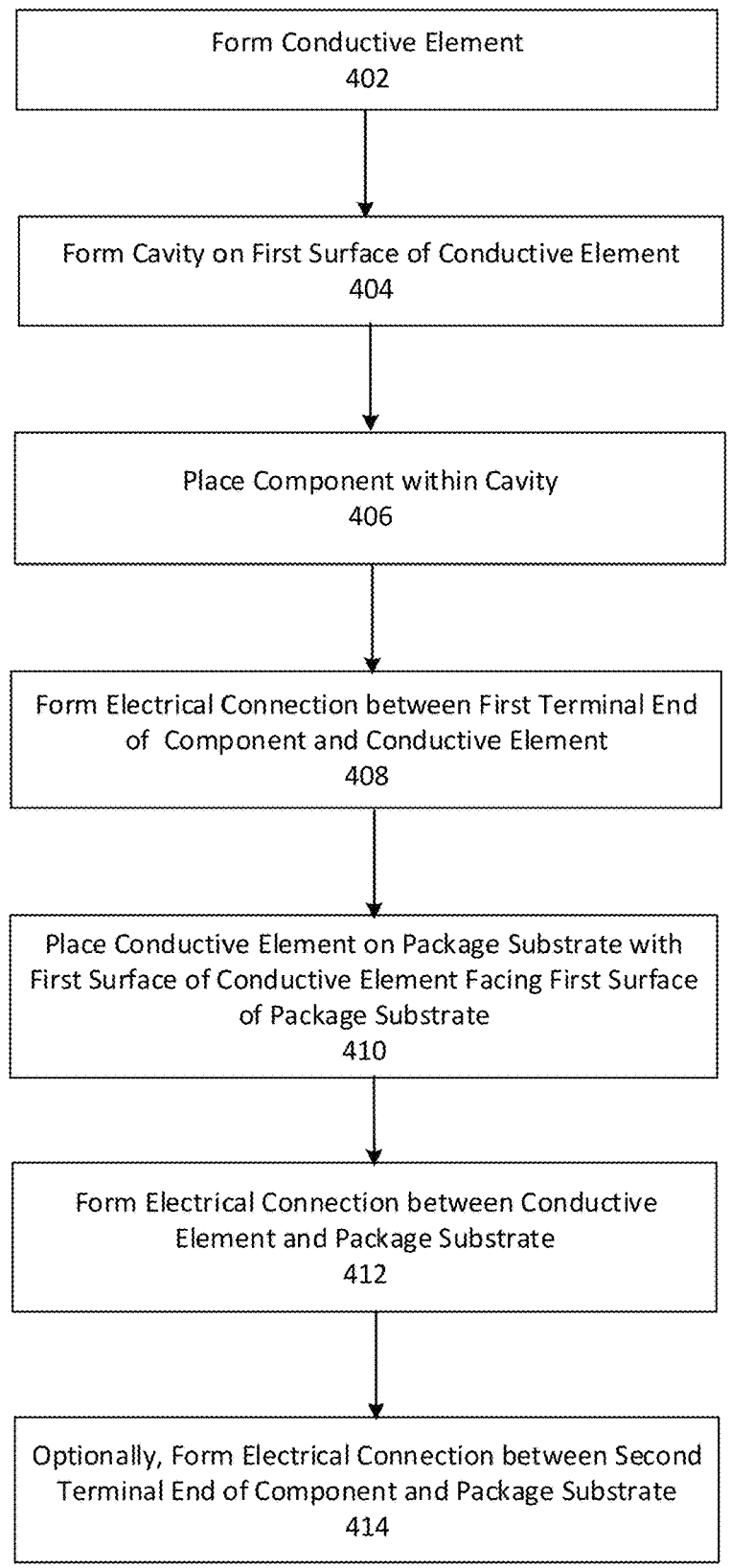
FIG. 4 is a flow diagram of an example method of manufacturing a package substrate including a conductive element with cavities for embedding components and electrical contacts for connecting the conductive element to the embedded components, in accordance with various embodiments.

FIG. 4 is a flow diagram of an example method of manufacturing a package substrate including a conductive element with cavities for embedding components and electrical contacts for connecting the embedded components to the conductive element, in accordance with various embodiments. At 402, a conductive element may be formed. At 404, recessed cavities may be formed on a first surface of the conductive element. In some embodiments, recessed cavities may be formed by punching or stamping the first surface of the conductive element. In some embodiments, depressed areas may be formed on a second surface of the conductive element to form the recessed cavities on the first surface of the conductive element. In some embodiments, the conductive element may be molded from a conductive material such that recessed cavities are formed on the first surface of the conductive element and the second surface of the conductive element remains planar. At 406, a component may be placed within the cavity, for example, using a pick and place process. At 408, an electrical connection may be formed in the cavity between the embedded component and the conductive element. For example, the electrical connection may be formed by a solder reflow process. At 410, the conductive element may be placed on the package substrate with the first surface of the conductive element facing a first surface of the package substrate such that electrical connections between the conductive element and, optionally, the embedded component, and the package substrate are aligned. At 412, an electrical connection may be formed between the conductive element and the package substrate. At 414, optionally, an electrical connection may be formed between the embedded component and the package substrate.

The finished substrate may be a single package substrate or may be a repeating unit that may undergo a singulation process in which each unit is separated for one another to create a single package substrate. Singulated substrates may be any suitable size and any suitable thickness; typically, substrates may range from 12 mm by 12 mm to 50 mm by 50 mm in size, and between 100 um and 2000 um in thickness.

Figure 5:
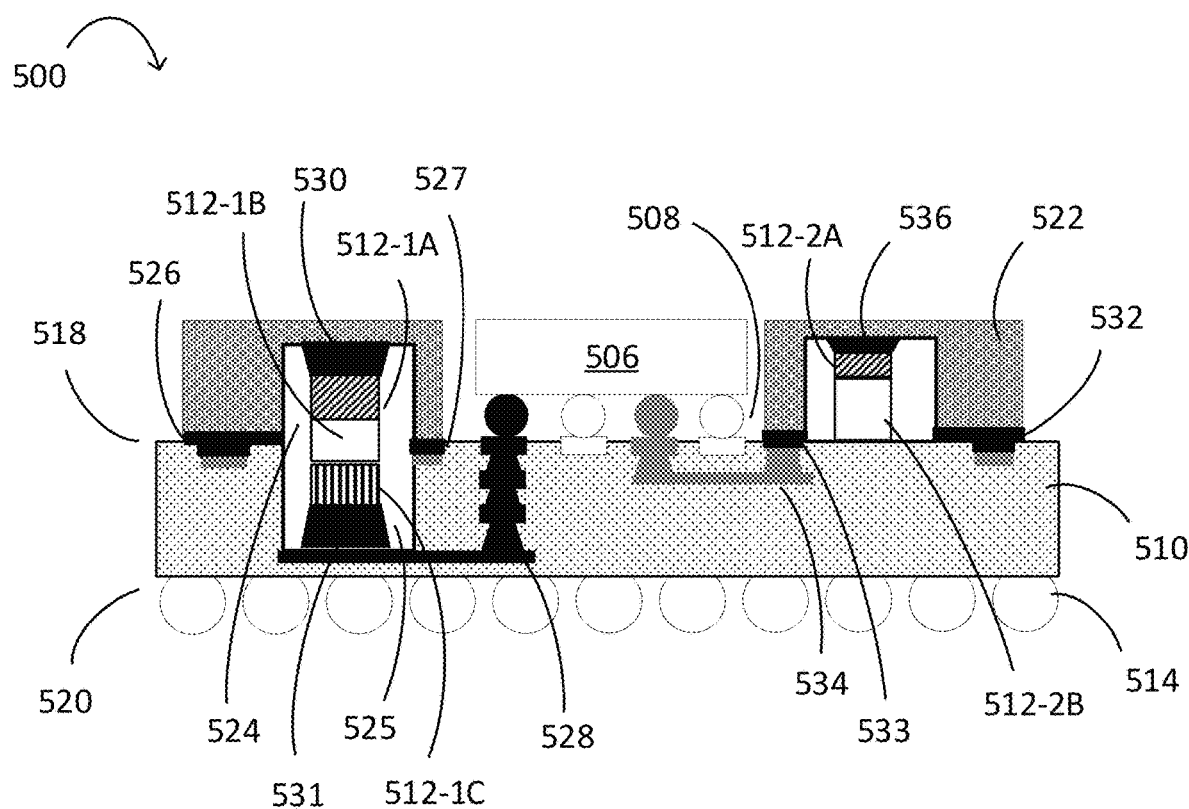
FIG. 5 is a schematic illustration of a cross-sectional side view of a portion of another example IC package having a package substrate that includes a conductive element with cavities for embedding large components and electrical contacts for connecting the conductive element to the embedded components, in accordance with various embodiments.

FIG. 5 is a schematic illustration of a cross-sectional side view of a portion of another example IC package having a package substrate that includes a conductive element with cavities for embedding a large component and electrical contacts for connecting the conductive element to the embedded component, in accordance with various embodiments. FIG. 5 shows integrated circuit package 500 having a package substrate 510, with the die 506 and the conductive element 522 with the embedded components 512-1, 512-2 disposed thereon. In particular, the die 506 may be coupled to a first face 518 of the package substrate 510 via first level interconnects 508. The package substrate 510 may be coupled to a circuit board (not shown) via the second level interconnects 514 disposed at the second face 520 of the package substrate 510. The conductive element 522 may be coupled to the package substrate 510 via one or more electrical connections 526, 527, 532, 533. The electrical connections 526, 527, 532, 533 may be designed to connect to corresponding ground and/or power sources on the package substrate. The conductive element 522 may include one or more cavities 524 on the first surface adjacent to the package substrate and may have one or more components 512-1, 512-2 attached within the cavities. Component 512-1 may have a non-conductive section 512-1B sandwiched between two conductive or terminal ends 512-1A, 512-1C. As illustrated in FIG. 5, component 512-1 may be a large component extending into a cavity or trench 525 within the package substrate 510. Component 512-1 may be positioned vertically with the two terminal ends at the top 512-1A and bottom 512-1C of the component, where the first terminal end 512-1A may be embedded in the cavity 524 in the conductive element 522 and may be electrically connected to the conductive element 522 via contact 530 and the second terminal end 512-1C may extend into the trench 525 within the package substrate 510 and may be electrically connected to the package substrate 510 via contact 531. As illustrated and as described previously in reference to FIG. 2B, conductive component 512-2 may include a conductive terminal end 512-2A and a non-conductive terminal end 512-2B. Conductive component 512-2 may be embedded in one or more cavities 524 in the conductive element 522 and electrically connected to conductive element 522 via contact 536. The package substrate 510 may include conductive pathways 528, 534 that electrically connect the die 506 to the embedded component 512-1 and the die 506 to the conductive element 522, respectively.

Figure 6:
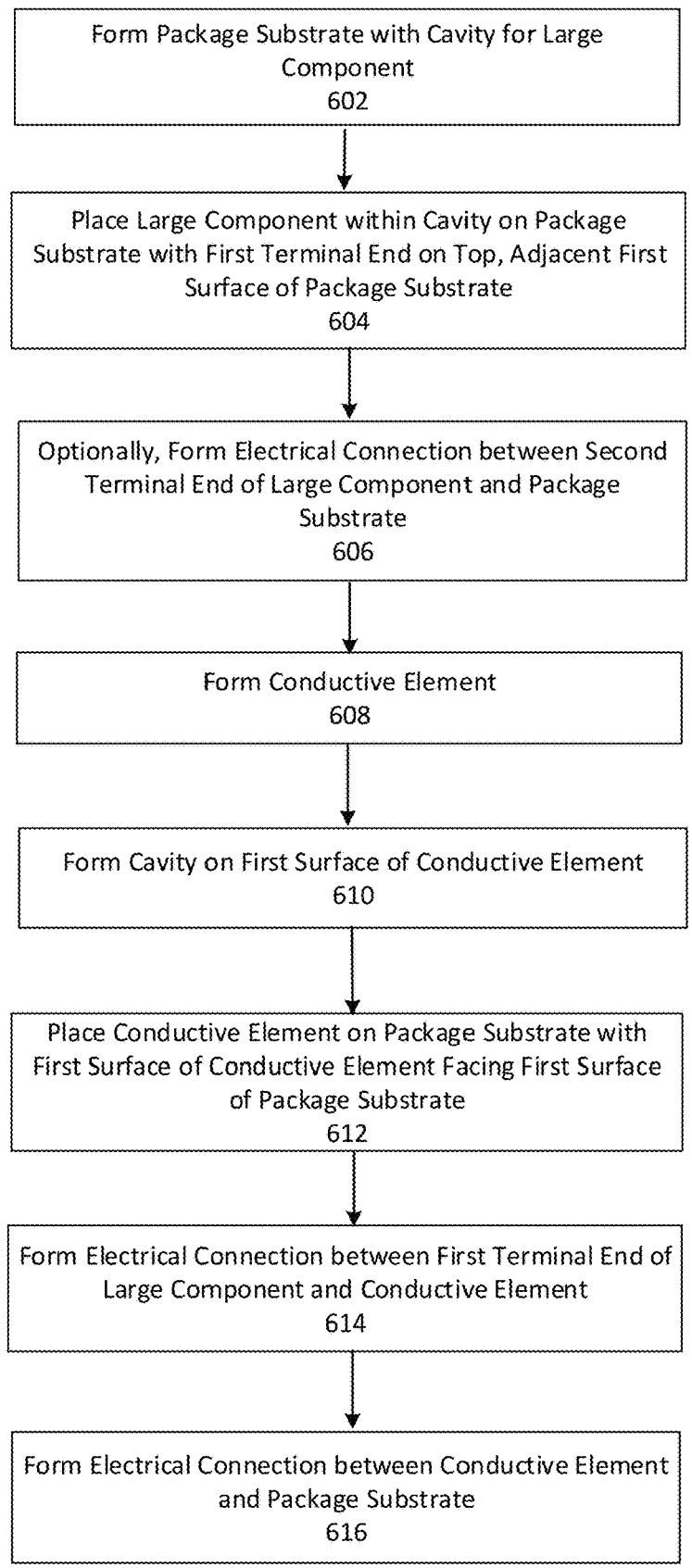
FIG. 6 is a flow diagram of an example method of manufacturing a package substrate including a conductive element with cavities for embedding large components and electrical contacts for connecting the conductive element to the embedded components, in accordance with various embodiments.

FIG. 6 is a flow diagram of an example method of manufacturing a package substrate including a conductive element with cavities for embedding large components and electrical contacts for connecting the conductive element to the embedded components, in accordance with various embodiments. At 602, a package substrate having a cavity for attaching a large component may be formed. The package substrate may be formed according to known methods, such as semi-additive process (SAP) where additional build-up layers in the package substrate may be constructed by laminating, curing, drilling and desmearing the dielectric layer followed by a plating process to form conductive layers or lines and conductive vias. The cavity in the package substrate may be formed using an etch stop material and laser drilling to open the cavity. At 604, the large component may be placed within the cavity in the package substrate with the first terminal end at the top, adjacent the first surface of the package substrate. At 606, optionally, an electrical connection may be formed between the second end of the large component and the package substrate. At 608, a conductive element may be formed. At 610, recessed cavities may be formed on a first surface of the conductive element. In some embodiments, recessed cavities may be formed by punching or stamping the first surface of the conductive element. In some embodiments, depressed areas may be formed on a second surface of the conductive element to form the recessed cavities on the first surface of the conductive element. In some embodiments, the conductive element may be molded from a conductive material such that recessed cavities are formed on the first surface of the conductive element and the second surface of the conductive element remains planar. A component other than the large component may be placed within the cavity on the conductive element, for example, using a pick and place process, and an electrical connection may be formed in the cavity between the embedded component and the conductive element. At 612, the conductive element may be placed on the package substrate with the first surface of the conductive element facing a first surface of the package substrate such that electrical connections between the conductive element and, optionally, the embedded component and large embedded component, and the package substrate are aligned. At 614, an electrical connection may be formed between the first terminal of the large component and the conductive element. At 616, an electrical connection may be formed between the conductive element and the package substrate. The conductive element may be attached to the package substrate using any suitable surface mounting process.

In some embodiments, the manufacturing of a large component may be in accordance with the process described in FIG. 4. For example, a conductive element with recessed cavities on a first surface of the conductive element maybe formed, a large component may be placed within a cavity on the conductive element, an electrical connection may be formed between the first terminal of the large component and the conductive element, the conductive element may be placed on the package with the second terminal end of the large component placed within the cavity on the package substrate, and an electrical connection may be formed between the conductive element and the package substrate.

Although the various operations discussed with reference to the methods are shown in a particular order, the operations may be performed in any suitable order (e.g., in any combination of parallel or series performance), and may be repeated or omitted as suitable.

The package substrates disclosed herein may be included in any suitable electronic device. FIGS. 7-9 illustrate various examples of apparatuses that may be included in, or that may include, one or more of any of the package substrates disclosed herein.

FIGS. 7A-B are top views of a wafer 701 and dies 705 that may be included in an IC package along with any of the package substrates having a conductive element with a cavity for a passive component and an electrical connection between the conductive element and passive component disclosed herein. The wafer 701 may be composed of semiconductor material and may include one or more dies 705 having IC elements formed on a surface of the wafer 701. Each of the dies 705 may be a repeating unit of a semiconductor product that includes any suitable IC. After the fabrication of the semiconductor product is complete, the wafer 701 may undergo a singulation process in which each of the dies 705 is separated from one another to provide discrete "chips" of the semiconductor product. The die 705 may include one or more transistors (e.g., some of the transistors 740 of FIG. 7C, discussed below) and/or supporting circuitry to route electrical signals to the transistors, as well as any other IC components. In some embodiments, the wafer 701 or the die 705 may include a memory device (e.g., a static random access memory (SRAM) device), a logic device (e.g., AND, OR, NAND, or NOR gate), or any other suitable circuit element. Multiple ones of these devices may be combined on a single die 705. For example, a memory array formed by multiple memory devices may be formed on a same die 705 as a processing device (e.g., the processing device 902 of FIG. 9) or other logic that is configured to store information in the memory devices or execute instructions stored in the memory array. In some embodiments, the die 705 may include circuitry that is to couple to and interact with circuitry provided by integral devices in the package substrate, after the die 705 is coupled to the package substrate, as discussed above.

FIG. 7C is a cross-sectional side view of an IC device 700 that may be included in a die that may be coupled to any of the package substrates disclosed herein. In particular, one or more of the IC devices 700 may be included in one or more dies. The IC device 700 may be formed on a substrate 702 (e.g., the wafer 701 of FIG. 7A) and may be included in a die (e.g., the die 705 of FIG. 7B). The substrate 702 may be a semiconductor substrate composed of semiconductor material systems including, for example, N-type or P-type materials systems. The substrate 702 may include, for example, a crystalline substrate formed using a bulk silicon or a silicon-on-insulator substructure. In some embodiments, the substrate 702 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 702. Although a few examples of materials from which the substrate 702 may be formed are described here, any material that may serve as a foundation for an IC device 700 may be used. The substrate 702 may be part of a singulated die (e.g., the dies 705 of FIG. 7B) or a wafer (e.g., the wafer 701 of FIG. 7A).

The IC device 700 may include one or more device layers 704 disposed on the substrate 702. The device layer 704 may include features of one or more transistors 740 (e.g., metal oxide semiconductor field-effect transistors (MOSFETs)) formed on the substrate 702. The device layer 704 may include, for example, one or more source and/or drain (S/D) regions 720, a gate 722 to control current flow in the transistors 740 between the S/D regions 720, and one or more S/D contacts 724 to route electrical signals to/from the S/D regions 720. The transistors 740 may include additional features not depicted for the sake of clarity, such as device isolation regions, gate contacts, and the like. The transistors 740 are not limited to the type and configuration depicted in FIG. 7C and may include a wide variety of other types and configurations such as, for example, planar transistors, non-planar transistors, or a combination of both. Nonplanar transistors may include FinFET transistors, such as double-gate transistors or tri-gate transistors, and wraparound or all-around gate transistors, such as nanoribbon and nanowire transistors.

Each transistor 740 may include a gate 722 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 740 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 740 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 720 may be formed within the substrate 702 adjacent to the gate 722 of each transistor 740. The S/D regions 720 may be formed using either an implantation/diffusion process or an etching/deposition process, for example. In the former process, dopants such as boron, aluminum, antimony, phosphorous, or arsenic may be ion-implanted into the substrate 702 to form the S/D regions 720. An annealing process that activates the dopants and causes them to diffuse farther into the substrate 702 may follow the ion-implantation process. In the latter process, the substrate 702 may first be etched to form recesses at the locations of the S/D regions 720. An epitaxial deposition process may then be carried out to fill the recesses with material that is used to fabricate the S/D regions 720. In some implementations, the S/D regions 720 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 720 may be formed using one or more alternate semiconductor materials such as germanium or a group III-V material or alloy. In further embodiments, one or more layers of metal and/or metal alloys may be used to form the S/D regions 720.

Electrical signals, such as power and/or input/output (I/O) signals, may be routed to and/or from the transistors 740 of the device layer 704 through one or more interconnect layers disposed on the device layer 704 (illustrated in FIG. 7C as interconnect layers 706-710). For example, electrically conductive features of the device layer 704 (e.g., the gate 722 and the S/D contacts 724) may be electrically coupled with the interconnect structures 728 of the interconnect layers 706-710. The one or more interconnect layers 706-710 may form an interlayer dielectric (ILD) stack 719 of the IC device 700.

The interconnect structures 728 may be arranged within the interconnect layers 706-710 to route electrical signals according to a wide variety of designs (in particular, the arrangement is not limited to the particular configuration of interconnect structures 728 depicted in FIG. 7C). Although a particular number of interconnect layers 706-710 is depicted in FIG. 7C, embodiments of the present disclosure include IC devices having more or fewer interconnect layers than depicted.

In some embodiments, the interconnect structures 728 may include trench structures 728a (sometimes referred to as "lines") and/or via structures 728b (sometimes referred to as "holes") filled with an electrically conductive material such as a metal. The trench structures 728a may be arranged to route electrical signals in a direction of a plane that is substantially parallel with a surface of the substrate 702 upon which the device layer 704 is formed. For example, the trench structures 728a may route electrical signals in a direction in and out of the page from the perspective of FIG. 7C. The via structures 728b may be arranged to route electrical signals in a direction of a plane that is substantially perpendicular to the surface of the substrate 702 upon which the device layer 704 is formed. In some embodiments, the via structures 728b may electrically couple trench structures 728a of different interconnect layers 706-710 together.

The interconnect layers 706-710 may include a dielectric material 726 disposed between the interconnect structures 728, as shown in FIG. 7C. In some embodiments, the dielectric material 726 disposed between the interconnect structures 728 in different ones of the interconnect layers 706-710 may have different compositions; in other embodiments, the composition of the dielectric material 726 between different interconnect layers 706-710 may be the same.

A first interconnect layer 706 (referred to as Metal 1 or "M1") may be formed directly on the device layer 704. In some embodiments, the first interconnect layer 706 may include trench structures 728a and/or via structures 728b, as shown. The trench structures 728a of the first interconnect layer 706 may be coupled with contacts (e.g., the S/D contacts 724) of the device layer 704.

A second interconnect layer 708 (referred to as Metal 2 or "M2") may be formed directly on the first interconnect layer 706. In some embodiments, the second interconnect layer 708 may include via structures 728b to couple the trench structures 728a of the second interconnect layer 708 with the trench structures 728a of the first interconnect layer 706. Although the trench structures 728a and the via structures 728b are structurally delineated with a line within each interconnect layer (e.g., within the second interconnect layer 708) for the sake of clarity, the trench structures 728a and the via structures 728b may be structurally and/or materially contiguous (e.g., simultaneously filled during a dual-damascene process) in some embodiments.

A third interconnect layer 710 (referred to as Metal 3 or "M3") (and additional interconnect layers, as desired) may be formed in succession on the second interconnect layer 708 according to similar techniques and configurations described in connection with the second interconnect layer 708 or the first interconnect layer 706.

The IC device 700 may include a solder resist material 734 (e.g., polyimide or similar material) and one or more bond pads 736 formed on the interconnect layers 706-710. The bond pads 736 may provide the contacts to couple to first level interconnects, for example. The bond pads 736 may be electrically coupled with the interconnect structures 728 and configured to route the electrical signals of the transistor(s) 740 to other external devices. For example, solder bonds may be formed on the one or more bond pads 736 to mechanically and/or electrically couple a chip including the IC device 700 with another component (e.g., a circuit board). The IC device 700 may have other alternative configurations to route the electrical signals from the interconnect layers 706-710 than depicted in other embodiments. For example, the bond pads 736 may be replaced by or may further include other analogous features (e.g., posts) that route the electrical signals to external components.

Figure 8:
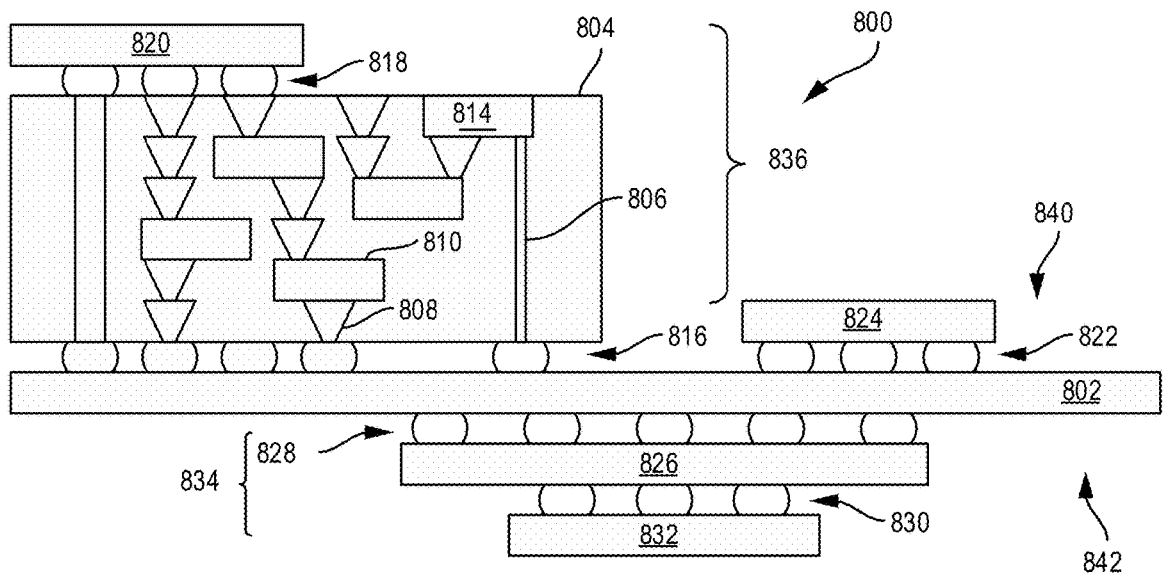
FIG. 8 is a cross-sectional side view of an integrated circuit device assembly that may include any of the embodiments of the IC structures disclosed herein.
Figure 9:
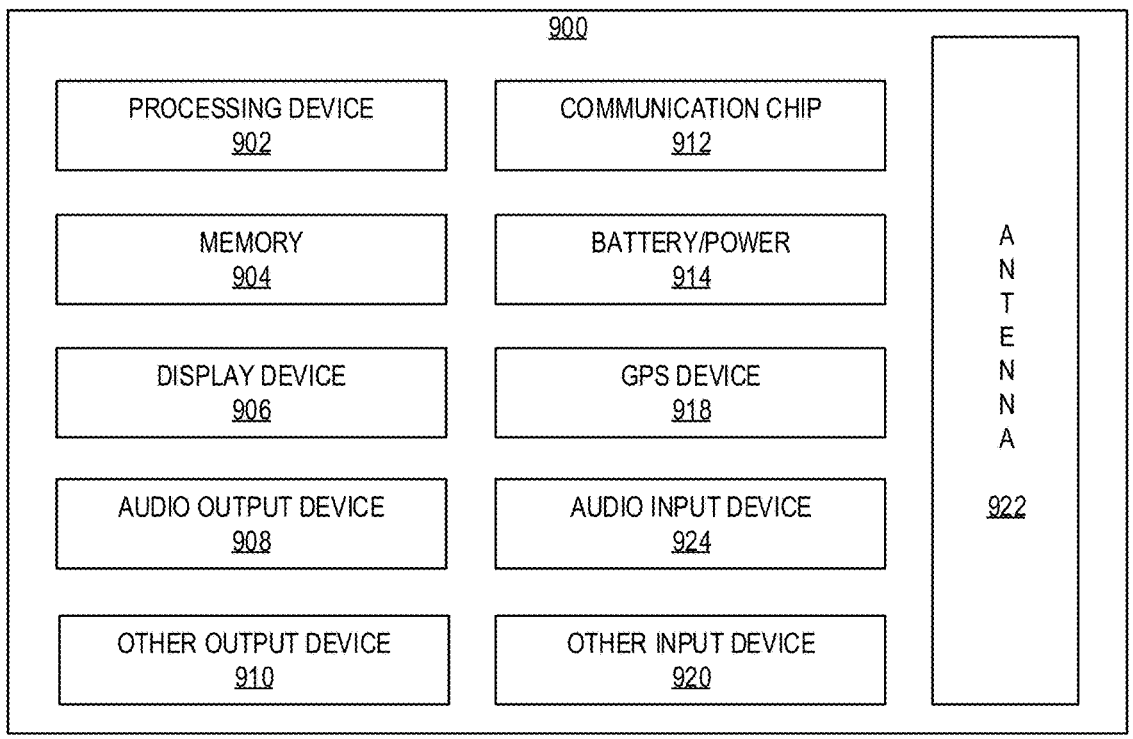
FIG. 9 is a block diagram of an example computing device that may include any of the embodiments of the IC structures disclosed herein.

FIG. 8 is a cross-sectional side view of an IC device assembly 800 that may include any of the embodiments of the package substrates disclosed herein. The IC device assembly 800 includes a number of components disposed on a circuit board 802. The IC device assembly 800 may include components disposed on a first face 840 of the circuit board 802 and an opposing second face 842 of the circuit board 802; generally, components may be disposed on one or both faces 840 and 842.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. For example, the coupling components 818 may be second level interconnects. Although a single IC package 820 is shown in FIG. 8, multiple IC packages may be coupled to the interposer 804; indeed, additional interposers may be coupled to the interposer 804. The interposer 804 may provide an intervening substrate used to bridge the circuit board 802 and the IC package 820. The IC package 820 may be or include, for example, a die (the die 705 of FIG. 7B), an IC device (e.g., the IC device 700 of FIG. 7C), or any other suitable component. In particular, the IC package 820 may take any of the embodiments of the IC package substrates disclosed herein, and may include a package substrate with a conductive element having a cavity for a passive component and where the conductive element is electrically connected to the passive component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804; in other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some embodiments, the interposer 804 may be formed of alternate rigid or flexible materials that may include the same materials used in a semiconductor substrate, such as silicon, germanium, and other group III-V and group IV materials. The interposer 804 may include metal interconnects 808 and vias 810, including but not limited to through-silicon vias (TSVs) 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820. In particular, the IC package 824 may take the form of any of the embodiments of the IC package disclosed herein, and may include a package substrate with a conductive element having a cavity for a passive component and where the conductive element is electrically connected to the passive component.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. In particular, the IC packages 826 and 832 may take any of the embodiments of the IC package substrate with a conductive element having a cavity for a passive component and where the conductive element is electrically connected to the passive component disclosed herein.

FIG. 9 is a block diagram of an example computing device 900 that may include one or more of the package substrates disclosed herein. For example, any suitable ones of the components of the computing device 900 may include, or be included in, an IC package having a package substrate with a conductive element having a cavity for a passive component and where the conductive element is electrically connected to the passive component, in accordance with any of the embodiments disclosed herein. A number of components are illustrated in FIG. 9 as included in the computing device 900, but any one or more of these components may be omitted or duplicated, as suitable for the application. In some embodiments, some or all of the components included in the computing device 900 may be attached to one or more motherboards. In some embodiments, some or all of these components are fabricated onto a single system-on-a-chip (SoC) die.

Additionally, in various embodiments, the computing device 900 may include interface circuitry for coupling to the one or more components. For example, the computing device 900 may not include a display device 906, but may include display device interface circuitry (e.g., a connector and driver circuitry) to which a display device 906 may be coupled. In another set of examples, the computing device 900 may not include an audio input device 924 or an audio output device 908, but may include audio input or output device interface circuitry (e.g., connectors and supporting circuitry) to which an audio input device 924 or audio output device 908 may be coupled.

The computing device 900 may include a processing device 902 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 902 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 900 may include a memory 904, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 904 may include memory that shares a die with the processing device 902. This memory may be used as cache memory and may include embedded dynamic random access memory (eDRAM) or spin transfer torque magnetic random-access memory (STT-MRAM).

In some embodiments, the computing device 900 may include a communication chip 912 (e.g., one or more communication chips). For example, the communication chip 912 may be configured for managing wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 912 may operate in accordance with other wireless protocols in other embodiments. The computing device 900 may include an antenna 922 to facilitate wireless communications and/or to receive other wireless communications (such as AM or FM radio transmissions).

In some embodiments, the communication chip 912 may manage wired communications, such as electrical, optical, or any other suitable communication protocols (e.g., the Ethernet). As noted above, the communication chip 912 may include multiple communication chips. For instance, a first communication chip 912 may be dedicated to shorter-range wireless communications such as Wi-Fi or Bluetooth, and a second communication chip 912 may be dedicated to longer-range wireless communications such as GPS, EDGE, GPRS, CDMA, WiMAX, LTE, EV-DO, or others. In some embodiments, a first communication chip 912 may be dedicated to wireless communications, and a second communication chip 912 may be dedicated to wired communications.

The computing device 900 may include battery/power circuitry 914. The battery/power circuitry 914 may include one or more energy storage devices (e.g., batteries or capacitors) and/or circuitry for coupling components of the computing device 900 to an energy source separate from the computing device 900 (e.g., AC line power).

The computing device 900 may include a display device 906 (or corresponding interface circuitry, as discussed above). The display device 906 may include any visual indicators, such as a heads-up display, a computer monitor, a projector, a touchscreen display, a liquid crystal display (LCD), a light-emitting diode display, or a flat panel display, for example.

The computing device 900 may include an audio output device 908 (or corresponding interface circuitry, as discussed above). The audio output device 908 may include any device that generates an audible indicator, such as speakers, headsets, or earbuds, for example.

The computing device 900 may include an audio input device 924 (or corresponding interface circuitry, as discussed above). The audio input device 924 may include any device that generates a signal representative of a sound, such as microphones, microphone arrays, or digital instruments (e.g., instruments having a musical instrument digital interface (MIDI) output).

The computing device 900 may include a global positioning system (GPS) device 918 (or corresponding interface circuitry, as discussed above). The GPS device 918 may be in communication with a satellite-based system and may receive a location of the computing device 900, as known in the art.

The computing device 900 may include an other output device 910 (or corresponding interface circuitry, as discussed above). Examples of the other output device 910 may include an audio codec, a video codec, a printer, a wired or wireless transmitter for providing information to other devices, or an additional storage device.

The computing device 900 may include an other input device 920 (or corresponding interface circuitry, as discussed above). Examples of the other input device 920 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 900 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 900 may be any other electronic device that processes data.

The following examples pertain to further embodiments. The various features of the different embodiments may be variously combined with some features included and others excluded to suit a variety of different applications.

Example 1 is an integrated circuit (IC) structure, including: a conductive element having opposing first and second faces, wherein the first face of the conductive element has a recessed cavity; and a component comprising a first terminal end electrically coupled to the conductive element, wherein the component is embedded in the recessed cavity.

Example 2 may include the subject matter of Example 1, and may further specify that the conductive element is on a package substrate and electrically coupled to the package substrate.

Example 3 may include the subject matter of Example 2, and may further specify that the electrical connection between the conductive element and the package substrate is associated with a ground reference voltage.

Example 4 may include the subject matter of Example 2, and may further specify that the electrical connection between the conductive element and the package substrate is associated with a power reference voltage.

Example 5 may include the subject matter of any of Examples 1-4, and may further specify that the component is an active component selected from the group consisting of a memory die, a field programmable gate array silicon die, and chip-type active component.

Example 6 may include the subject matter of any of Examples 1-4, and may further specify that the component is a passive component selected from the group consisting of resistor, capacitor, inductor, and chip-type passive component.

Example 7 may include the subject matter of any of Examples 1-6 and may further specify that the component is positioned vertically within the cavity of the conductive element with the first terminal end facing into the cavity.

Example 8 may include the subject matter of Example 2 and may further specify that the component further comprises a second terminal end electrically coupled to the package substrate.

Example 9 may include the subject matter of Example 1 and may further specify that the conductive element material comprises one or more of copper, nickel, aluminum, titanium, stainless steel, beryllium, molybdenum, tungsten, silicon carbide, and tungsten carbide.

Example 10 may include the subject matter of Example 1 and may further specify that the conductive element material has Young's modulus value of about 90 GPa or greater.

Example 11 may include the subject matter of Example 1 and may further specify that the conductive element is a metal stiffener.

Example 12 is an integrated circuit (IC) package, including: a first conductive element having opposing first and second faces, wherein the first face of the first conductive element has a recessed cavity; a first component comprising a first terminal end electrically coupled to the first conductive element, wherein the first component is embedded in the recessed cavity of the first conductive element; and a package substrate having opposing first and second faces, wherein the first conductive element is placed on the package substrate with the first face of the first conductive element facing the first face of the package substrate and is electrically coupled to the package substrate.

Example 13 may include the subject matter of Example 12 and may further specify that the electrical connection between the first conductive element and the package substrate is associated with a ground reference voltage.

Example 14 may include the subject matter of Example 12 and may further specify that the electrical connection between the first conductive element and the package substrate is associated with a power reference voltage.

Example 15 may include the subject matter of any of Examples 12-14 and may further specify that the first component is an active component selected from the group consisting of a memory die, a field programmable gate array silicon die, and chip-type active component.

Example 16 may include the subject matter of any of Examples 12-14 and may further specify that the first component is a passive component selected from the group consisting of resistor, capacitor, inductor, and chip-type passive component.

Example 17 may include the subject matter of any of Examples 12-16 and may further specify that the first component is positioned vertically within the cavity of the conductive element with the first terminal end facing into the cavity.

Example 18 may include the subject matter of Example 12 and may further specify that the first component further comprises a second terminal end electrically coupled to the package substrate.

Example 19 may include the subject matter of Example 12 and may further specify that the conductive element material comprises one or more of copper, nickel, aluminum, titanium, stainless steel, beryllium, molybdenum, tungsten, silicon carbide, and tungsten carbide.

Example 20 may include the subject matter of Example 12 and may further specify that the conductive element material has Young's modulus value of about 90 GPa or greater.

Example 21 may include the subject matter of Example 12 and may further specify that the conductive element is a metal stiffener and provides stability to the package substrate.

Example 22 may include the subject matter of Example 12 and may further include: a second conductive element having opposing first and second faces, wherein the first face of the second conductive element has a recessed cavity; a second component comprising a first terminal end electrically coupled to the second conductive element, wherein the second component is embedded in the recessed cavity of the second conductive element; and wherein the second conductive element is on the package substrate with the first face of the second conductive element facing the first face of the package substrate and is electrically coupled to the package substrate.

Example 23 may include the subject matter of Example 22 and may further specify that the electrical connection between the second conductive element and the package substrate is associated with a ground reference voltage.

Example 24 may include the subject matter of Example 22 and may further specify that the electrical connection between the second conductive element and the package substrate is associated with a power reference voltage.

Example 25 may include the subject matter of Example 22 and may further specify that the reference voltage of the electrical connection between the first conductive element and the package substrate is the same as the reference voltage of the electrical connection between the second conductive element and the package substrate.

Example 26 may include the subject matter of Example 22 and may further specify that the reference voltage of the electrical connection between the first conductive element and the package substrate is opposite the reference voltage of the electrical connection between the second conductive element and the package substrate.

Example 27 is a method for fabricating an integrated circuit (IC) package, the method including: forming a conductive element having first and second faces; forming a cavity on the first face of the conductive element; placing a component comprising a first terminal end within the cavity; forming an electrical connection between the first terminal end and the conductive element; placing the conductive element on a package substrate with the first face of the conductive element facing a first surface of the package substrate; and forming an electrical connection between the conductive element and the package substrate.

Example 28 may include the subject matter of Example 27 and may further specify that the component is positioned vertically within the cavity of the conductive element with the first terminal end facing into the cavity.

Example 29 may include the subject matter of Example 27 and may further specify that the component further comprises a second terminal end opposite the first terminal end, and the method may further include: forming an electrical connection between the second terminal end and the package substrate.

Example 30 may include the subject matter of Example 27 and may further specify that the electrical connection between the conductive element and the package substrate is associated with a ground reference voltage.

Example 31 may include the subject matter of Example 27 and may further specify that the electrical connection between the conductive element and the package substrate is associated with a power reference voltage.

Example 32 is a computing device, including: a circuit board; and an integrated circuit (IC) package, wherein the IC package includes: a first conductive stiffener having opposing first and second faces, wherein the first face of the first conductive stiffener has a recessed cavity, and wherein the first conductive stiffener material comprises one or more of copper, nickel, aluminum, titanium, stainless steel, beryllium, molybdenum, tungsten, silicon carbide, and tungsten carbide; a first component comprising a first terminal end electrically coupled to the first conductive stiffener, wherein the first component is embedded in the recessed cavity of the first conductive stiffener; and a package substrate having opposing first and second faces, wherein the first conductive stiffener is on the package substrate with the first face of the first conductive stiffener facing the first face of the package substrate and is electrically coupled to the package substrate.

Example 33 may include the subject matter of Example 32 and may further specify that the electrical connection between the first conductive stiffener and the package substrate is associated with a ground reference voltage.

Example 34 may include the subject matter of Example 32 and may further specify that the electrical connection between the first conductive stiffener and the package substrate is associated with a power reference voltage.

Example 35 may include the subject matter of any of Examples 32-34 and may further specify that the first component is an active component selected from the group consisting of a memory die, a field programmable gate array silicon die, and chip-type active component.

Example 36 may include the subject matter of any of Examples 32-34 and may further specify that the first component is a passive component selected from the group consisting of resistor, capacitor, inductor, and chip-type passive component.

Example 37 may include the subject matter of any of Examples 32-36 and may further specify that the first component is positioned vertically within the cavity of the first conductive stiffener with the first terminal end facing into the cavity.

Example 38 may include the subject matter of Example 32 and may further specify that the first component further comprises a second terminal end electrically coupled to the package substrate.

Example 39 may include the subject matter of Example 32 and may further specify that the IC package further includes: a second conductive stiffener having opposing first and second faces, wherein the first face of the second conductive stiffener has a recessed cavity; a second component comprising a first terminal end electrically coupled to the second conductive stiffener, wherein the second component is embedded in the recessed cavity of the second conductive stiffener; and wherein the second conductive stiffener is on the package substrate with the first face of the second conductive stiffener facing the first face of the package substrate and is electrically coupled to the package substrate.

Example 40 may include the subject matter of Example 39 and may further specify that the electrical connection between the second conductive stiffener and the package substrate is associated with a ground reference voltage.

Example 41 may include the subject matter of Example 39 and may further specify that the electrical connection between the second conductive stiffener and the package substrate is associated with a power reference voltage.

Example 42 may include the subject matter of Example 39 and may further specify that the reference voltage of the electrical connection between the first conductive stiffener and the package substrate is the same as the reference voltage of the electrical connection between the second conductive stiffener and the package substrate.

Example 43 may include the subject matter of Example 39 and may further specify that the reference voltage of the electrical connection between the first conductive stiffener and the package substrate is opposite the reference voltage of the electrical connection between the second conductive stiffener and the package substrate.

The invention claimed is:

1. An integrated circuit (IC) structure, comprising:
   a package substrate having a first contact and a second contact on a surface and a conductive pathway electrically coupled to the second contact;
   a die electrically coupled to the surface of the package substrate;
   a conductive element having opposing first and second faces, wherein the first face of the conductive element has a recessed cavity, wherein the first face of the conductive element is electrically coupled to the package substrate via the first contact and is electrically coupled to the die via the second contact and the conductive pathway in the package substrate; and
   a component embedded in the recessed cavity of the conductive element and having a first terminal end electrically coupled to the conductive element.

2. The IC structure of claim 1, wherein the electrical connection between the conductive element and the package substrate is associated with a ground reference voltage.

3. The IC structure of claim 1, wherein the electrical connection between the conductive element and the package substrate is associated with a power reference voltage.

4. The IC structure of claim 1, wherein the component is an active component selected from the group consisting of a memory die, a field programmable gate array silicon die, and chip-type active component.

5. The IC structure of claim 1, wherein the component is a passive component selected from the group consisting of resistor, capacitor, inductor, and chip-type passive component.

6. The IC structure of claim 1, wherein the component is positioned vertically within the cavity of the conductive element with the first terminal end facing into the cavity.

7. The IC structure of claim 1, wherein the component further comprises a second terminal end electrically coupled to the package substrate via a third contact on the surface of the package substrate.

8. The IC structure of claim 1, wherein the conductive element material comprises one or more of copper, nickel, aluminum, titanium, stainless steel, beryllium, molybdenum, tungsten, silicon carbide, and tungsten carbide.

9. The IC structure of claim 1, wherein the conductive element material has Young's modulus value of about 90 GPa or greater.

10. The IC structure of claim 1, wherein the conductive element is a metal stiffener.

11. An integrated circuit (IC) package, comprising:
    a package substrate including a first contact, a second contact, and a third contact on a surface, and a conductive pathway electrically coupling the second contact and the third contact;
    a die electrically coupled to the third contact on the surface of the package substrate;
    a first conductive element having opposing first and second faces, wherein the first face of the first conductive element has a recessed cavity, wherein the first face of the first conductive element is electrically coupled to the package substrate via the first contact and is electrically coupled to the die via the second contact and the conductive pathway in the package substrate; and
    a first component embedded in the recessed cavity of the first conductive element and having a first terminal end electrically coupled to the conductive element.

12. The IC package of claim 11, wherein the conductive element is a metal stiffener and provides stability to the package substrate.

13. The IC package of claim 11, wherein the package substrate further includes a fourth contact on the surface of the package substrate, and the IC package further comprising:
    a second conductive element having opposing first and second faces, wherein the first face of the second conductive element has a recessed cavity, wherein the first face of the second conductive element is electrically coupled to the package substrate via the fourth contact; and
    a second component embedded in the recessed cavity of the second conductive element and having a first terminal end electrically coupled to the conductive element.

14. The IC package of claim 13, wherein the reference voltage of the electrical connection between the first conductive element and the package substrate via the first contact is the same as the reference voltage of the electrical connection between the second conductive element and the package substrate via the fourth contact.

15. The IC package of claim 13, wherein the reference voltage of the electrical connection between the first conductive element and the package substrate via the first contact is opposite the reference voltage of the electrical connection between the second conductive element and the package substrate via the fourth contact.

16. A method for fabricating an integrated circuit (IC) package, the method comprising:
    forming a conductive element having first and second faces;
    forming a cavity on the first face of the conductive element;
    placing a component comprising a first terminal end within the cavity;
    forming an electrical connection between the first terminal end and the conductive element;
    placing the conductive element on a package substrate with the first face of the conductive element facing a surface of the package substrate;
    forming an electrical connection between the conductive element and the package substrate via a first contact on the surface of the package substrate; and
    forming an electrical connection between the conductive element and a die on the surface of the package substrate via a conductive pathway within the package substrate.

17. The method of claim 16, wherein the component is positioned vertically within the cavity of the conductive element with the first terminal end facing into the cavity.

18. The method of claim 16, wherein the component further comprises a second terminal end opposite the first terminal end, the method further comprising:
    forming an electrical connection between the second terminal end and the package substrate via a second contact on the surface of the package substrate.

19. The method of claim 16, wherein the electrical connection between the conductive element and the package substrate via the first contact is associated with a ground reference voltage.

20. The method of claim 16, wherein the electrical connection between the conductive element and the package substrate via the first contact is associated with a power reference voltage.

21. A computing device, comprising:
a circuit board; and
an integrated circuit (IC) package, wherein the IC package comprises:
- a package substrate including a first contact, a second contact, and a third contact on a surface, and a conductive pathway electrically coupling the second contact and the third contact;
- a die electrically coupled to the third contact on the surface of the package substrate;
- a conductive stiffener having opposing first and second faces, wherein the first face of the conductive stiffener has a recessed cavity, wherein the first face of the conductive stiffener is electrically coupled to the package substrate via the first contact and is electrically coupled to the die via the second contact and the conductive pathway in the package substrate, and wherein the first conductive stiffener material comprises one or more of copper, nickel, aluminum, titanium, stainless steel, beryllium, molybdenum, tungsten, silicon carbide, and tungsten carbide; and
- a component embedded in the recessed cavity of the conductive stiffener and having a first terminal end electrically coupled to the conductive stiffener.

22. The computing device of claim 21, wherein the component is a passive component selected from the group consisting of resistor, capacitor, inductor, and chip-type passive component.

23. The computing device of claim 21, wherein the component is positioned vertically within the cavity of the conductive stiffener with the first terminal end facing into the cavity.

24. The computing device of claim 21, wherein the component further comprises a second terminal end electrically coupled to the package substrate via a fourth contact on the surface of the package substrate.

* * * * *